(12) United States Patent
Katayama et al.

(10) Patent No.: US 12,431,851 B2
(45) Date of Patent: Sep. 30, 2025

(54) AUDIO MIXING DEVICE AND ELECTRONIC DEVICE

(71) Applicant: SEIKO EPSON CORPORATION, Tokyo (JP)

(72) Inventors: Takao Katayama, Matsumoto (JP); Fumihito Baisho, Kai (JP); Tsutomu Nonaka, Hino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 213 days.

(21) Appl. No.: 18/460,187

(22) Filed: Sep. 1, 2023

(65) Prior Publication Data

US 2024/0088855 A1    Mar. 14, 2024

(30) Foreign Application Priority Data

Sep. 5, 2022  (JP) ................. 2022-140585

(51) Int. Cl.
*H03G 3/00* (2006.01)
*H03G 3/30* (2006.01)
*H04B 1/00* (2006.01)

(52) U.S. Cl.
CPC ........... *H03G 3/002* (2013.01); *H03G 3/3005* (2013.01); *H03G 2201/10* (2013.01); *H03G 2201/30* (2013.01); *H03G 2201/70* (2013.01)

(58) Field of Classification Search
CPC .. H03G 3/002; H03G 3/3005; H03G 2201/10; H03G 2201/30; H03G 2201/70
USPC .................................................. 381/104.119
See application file for complete search history.

(56) References Cited

U.S. PATENT DOCUMENTS

| | | |
|---|---|---|
| 9,646,586 B2 | 5/2017 | Shirai |
| 11,288,033 B2 | 3/2022 | Sun |
| 2013/0031287 A1 | 1/2013 | Miyake |
| 2015/0333855 A1* | 11/2015 | Gebauer ............... H04R 3/005 381/119 |
| 2015/0363155 A1 | 12/2015 | Hayashi et al. |
| 2017/0288798 A1 | 10/2017 | Saito et al. |
| 2019/0138262 A1 | 5/2019 | Becherer et al. |
| 2019/0191261 A1 | 6/2019 | Saito |
| 2022/0147310 A1 | 5/2022 | Saito et al. |
| 2022/0345820 A1 | 10/2022 | Dickins et al. |
| 2023/0419982 A1 | 12/2023 | Travaglini et al. |
| 2024/0088855 A1 | 3/2024 | Katayama et al. |

FOREIGN PATENT DOCUMENTS

| | | |
|---|---|---|
| CN | 101727907 A | 6/2010 |
| JP | 2013-29977 A | 2/2013 |
| JP | 2014-137790 A | 7/2014 |

\* cited by examiner

*Primary Examiner* — Ammar T Hamid
(74) *Attorney, Agent, or Firm* — Rankin, Hill & Clark LLP

(57) ABSTRACT

An audio mixing device includes a gain setting circuit configured to set first to n-th gains based on a command input from the outside, n being an integer of two or more, and a mixing circuit configured to output a mixing signal obtained by mixing two or more of first to n-th multiplication data obtained by respectively multiplying first to n-th audio data by the first to n-th gains. In a case where the j-th gain of the first to n-th gains is set to a first value, when the j-th gain is to be set to a second value different from the first value, the gain setting circuit transitions the j-th gain from the first value to the second value in a stepwise manner in a j-th gain change section of first to n-th gain change sections.

10 Claims, 12 Drawing Sheets

AUDIO MIXING DEVICE AND ELECTRONIC DEVICE

The present application is based on, and claims priority from JP Application Serial Number 2022-140585, filed Sep. 5, 2022, the disclosure of which is hereby incorporated by reference herein in its entirety.

BACKGROUND

1. Technical Field

The present disclosure relates to an audio mixing device and an electronic device.

2. Related Art

JP-A-2014-137790 discloses an audio output control device that acquires end time information related to an estimated time at which transmission of a meaningful content of earlier audio information is completed, acquires delay permissible information related to a permissible time of delay from a time when a request for outputting later audio information is made until the output of the later audio information starts, determines whether standby for outputting the later audio information is allowed according to a temporal relation between the end time information and the delay permissible information, stands by for outputting the later audio information under a condition that it is determined that standby is allowed, and outputs the later audio information after preferentially executing the output of the earlier audio information.

In the device described in JP-A-2014-137790, there is a concern that output of either the earlier audio information or the later audio information may be delayed even when both are important information that requires urgency, which may delay a necessary treatment by a user with respect to the audio information whose output is delayed.

SUMMARY

An aspect of an audio mixing device according to the present disclosure includes: a gain setting circuit configured to set first to n-th gains based on a command input from the outside, n being an integer of two or more; and a mixing circuit configured to output a mixing signal obtained by mixing two or more of first to n-th multiplication data obtained by respectively multiplying first to n-th audio data by the first to n-th gains. In a case where the j-th gain of the first to n-th gains is set to a first value, when the j-th gain is to be set to a second value different from the first value, the gain setting circuit transitions the j-th gain from the first value to the second value in a stepwise manner in a j-th gain change section of first to n-th gain change sections.

An aspect of an electronic device according to the present disclosure includes the aspect of the audio mixing device.

DESCRIPTION OF EMBODIMENTS

Hereinafter, preferred embodiments of the present disclosure will be described in detail with reference to the drawings. The embodiments to be described below do not unduly limit contents of the present disclosure described in the claims. Not all configurations to be described below are necessarily essential constituent elements of the present disclosure.

1. Audio Mixing Device

1-1. First Embodiment

Figure 1:
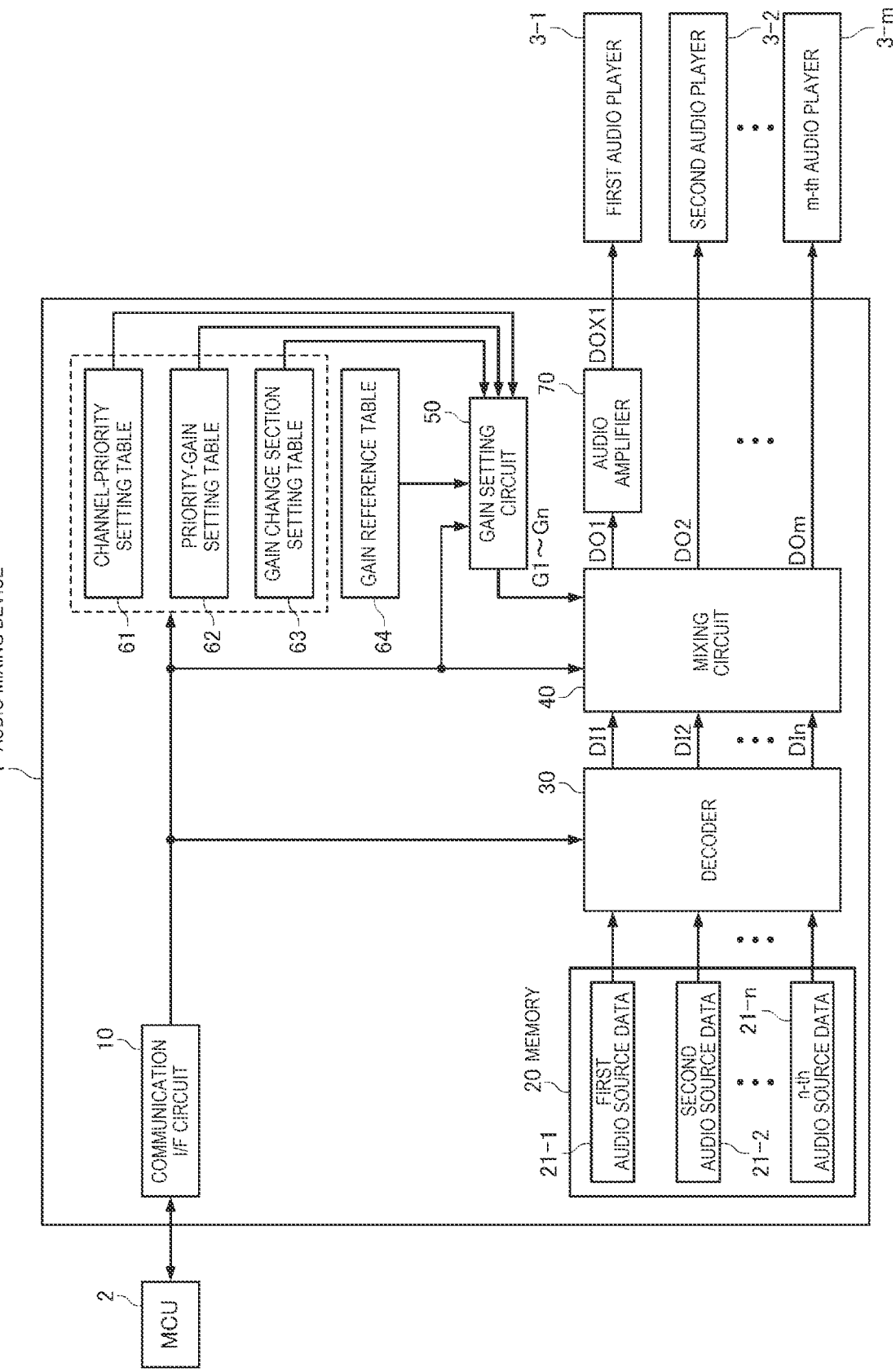
FIG. 1 is a diagram showing a configuration example of an audio mixing device according to a first embodiment.

FIG. 1 is a diagram showing a configuration example of an audio mixing device according to a first embodiment. As shown in FIG. 1, the audio mixing device 1 according to the first embodiment includes a communication interface circuit 10, a memory 20, a decoder 30, a mixing circuit 40, a gain setting circuit 50, a channel-priority setting table 61, a priority-gain setting table 62, a gain change section setting table 63, a gain reference table 64, and an audio amplifier 70. The audio mixing device 1 may be a single-chip semiconductor integrated circuit device, or a multi-chip semiconductor integrated circuit device, or at least a part of the audio mixing device 1 may be implemented by an electronic component other than the semiconductor integrated circuit device.

The memory 20 stores first to n-th audio source data 21-1 to 21-$n$ that are n pieces of audio source data. That is, the first to the n-th audio source data 21-1 to 21-$n$ are stored in the memory 20. Here, n is an integer of two or more. The memory 20 may be, for example, a flash memory. The first to n-th audio source data 21-1 to 21-$n$ may be, for example, PCM audio data, or may be ADPCM audio data. PCM is an abbreviation of pulse code modulation, and ADPCM is an abbreviation of adaptive differential pulse code modulation. The first to n-th audio source data 21-1 to 21-$n$ may be, for example, data that serve as a base of various kinds of sounds such as a sound imitating a voice when a person speaks, a mechanical warning sound, a sound effect, or the like.

The communication interface circuit 10 is a circuit that performs data communication with a micro-control unit 2.

The communication interface circuit 10 may be, for example, an SPI interface circuit or an I2C interface circuit. SPI is an abbreviation of serial peripheral interface, and I2C is an abbreviation of inter-integrated circuit.

The communication interface circuit 10 receives various commands transmitted from the micro-control unit 2, and generates various control signals corresponding to the received commands. For example, when the communication interface circuit 10 receives an audio play command or an audio stop command for the i-th audio source data 21-$i$ of the first to n-th audio source data 21-1 to 21-$n$ stored in the memory 20, the communication interface circuit 10 generates a control signal that instructs audio play or audio stop for the i-th audio source data 21-$i$, and outputs the control signal to the decoder 30 and the gain setting circuit 50. Further, for example, when the communication interface circuit 10 receives a data write command for the channel-priority setting table 61, the priority-gain setting table 62, or the gain change section setting table 63, the communication interface circuit 10 generates a control signal for writing data designated by an address designated by the command.

The decoder 30 includes first to n-th input channels and first to n-th output channels. The decoder 30 reads the i-th audio source data 21-$i$ from the memory 20 to the i-th input channel in response to a control signal that instructs audio play for the i-th audio source data 21-$i$ output from the communication interface circuit 10, decodes the i-th audio source data 21-$i$, and demodulates i-th audio data DIi. As described above, the first to n-th audio source data 21-1 to 21-$n$ stored in the memory 20 are data that serve as a base of first to n-th audio data DI1 to DIn. The decoder 30 outputs the demodulated i-th audio data DIi to the i-th output channel. The decoder 30 stops the output of the i-th audio data DIi to the i-th output channel in response to a control signal that instructs audio stop for the i-th audio source data 21-$i$ output from the communication interface circuit 10. The decoder 30 may stop the output of the i-th audio data DIi to the i-th output channel when the demodulation is completed up to an end of the i-th audio source data 21-$i$.

The mixing circuit 40 outputs a mixing signal DO1 obtained by mixing two or more of first to n-th multiplication data obtained by respectively multiplying the first to n-th audio data DI1 to DIn by first to n-th gains G1 to Gn. The mixing circuit 40 includes first to n-th input channels, and the first to n-th input channels are respectively coupled to the first to n-th output channels of the decoder 30. The i-th gain Gi of the first to n-th gains G1 to Gn is set in the i-th input channel of the first to n-th input channels of the mixing circuit 40, and the i-th audio data DIi of the first to n-th audio data DI1 to DIn is input to the i-th input channel. The mixing circuit 40 includes first to m-th output channels, and outputs the mixing signal DO1 from the first output channel to the audio amplifier 70. Here, m is an integer of two or more.

The audio amplifier 70 converts the mixing signal DO1 output from the mixing circuit 40 into an audio signal DOX1 and outputs the audio signal DOX1 to a first audio player 3-1. Accordingly, audio corresponding to the audio signal DOX1 is output from the first audio player 3-1. For example, the first audio player 3-1 may be a speaker.

The mixing circuit 40 may output, as audio signals DO2 to DOm, m−1 pieces of multiplication data selected from the first to n-th multiplication data, from the second to m-th output channels to second to m-th audio players 3-2 to 3-$m$. Accordingly, audio corresponding to the audio signals DO2 to DOm is output from the second to m-th audio players 3-2 to 3-$m$. For example, each of the second to m-th audio players 3-2 to 3-$m$ may be a buzzer.

The audio output from the first to m-th audio players 3-1 to 3-$m$ may be, for example, a sound imitating a voice when a person speaks, or may be various kinds of sounds such as a mechanical warning sound, a sound effect, and the like.

The gain setting circuit 50 sets the first to n-th gains G1 to Gn in the respective first to n-th input channels of the mixing circuit 40 based on commands input from the outside of the audio mixing device 1. Specifically, when the gain setting circuit 50 receives a control signal that instructs audio play or audio stop for the k-th audio source data 21-$k$ output from the communication interface circuit 10, the gain setting circuit 50 refers to the channel-priority setting table 61, the priority-gain setting table 62, and the gain reference table 64, determines priorities of the k-th audio data DIk and all pieces of audio data of the first to n-th audio data DI1 to DIn during play, and sets gains having values corresponding to the priorities to respective channels.

The channel-priority setting table 61 is a table that defines a correspondence relation between the first to n-th input channels of the mixing circuit 40 and priorities thereof. The priority-gain setting table 62 is a table that defines a correspondence relation between gain setting values and the priorities that can be designated in the channel-priority setting table 61. The gain reference table 64 is a table that defines a correspondence relation between gain values and the gain setting values that can be designated in the priority-gain setting table 62. The channel-priority setting table 61 and the priority-gain setting table 62 are stored in a RAM or a register (not shown), and are rewritten by a command input from the outside of the audio mixing device 1. RAM is an abbreviation of random access memory. The gain reference table 64 is stored in a ROM (not shown) and is not rewritten. ROM is an abbreviation of read only memory.

When the k-th audio data of the first to n-th audio data DI1 to DIn is not to be played, the gain setting circuit 50 may set the k-th gain Gk to 0, or the decoder 30 may output 0 to the k-th output channel.

In the embodiment, in a case where the j-th gain Gj of the first to n-th G1 to Gn is set to a first value, when the j-th gain Gj is to be set to a second value different from the first value, the gain setting circuit 50 transitions the j-th gain Gj from the first value to the second value in a stepwise manner in a j-th gain change section $T_j$ of first to n-th gain change sections $T_1$ to $T_n$. For example, during play of the j-th audio data DIj of the first to n-th audio data DI1 to DIn in a case where the j-th gain Gj is set to the first value, the gain setting circuit 50 sets the j-th gain Gj to the second value when the gain setting circuit 50 receives a command indicating to start or stop play of the k-th audio data DIk having a higher priority than the j-th audio data DIj from the outside of the audio mixing device 1. Here, when the gain setting circuit 50 receives a command indicating to start play of the k-th audio data DIk, the second value is smaller than the first value, and when the gain setting circuit 50 receives a command indicating to stop play of the k-th audio data DIk, the second value is larger than the first value.

In the embodiment, when a setting value of the j-th input channel among the first to n-th input channels is changed from a first value to a second value, the gain setting circuit 50 refers to the gain change section setting table 63 and sets the j-th gain change section $T_j$ to the j-th input channel. The gain change section setting table 63 is a table that defines first to n-th gain change sections, and specifically, a table that defines a correspondence relation between the first to n-th input channels, sample steps, and gain steps. The gain change section setting table 63 is stored in a RAM or a register (not shown), and is rewritten by a command input from the outside of the audio mixing device 1.

For example, when a sample step is set to 1 and a gain step is set to 0.5 dB for the j-th input channel in the gain change section setting table 63, the gain setting circuit 50 transitions the j-th gain Gj from the first value by 0.5 dB in a stepwise manner for every sample of the j-th audio data Dj until the j-th gain Gj reaches the second value. In this case, for example, when a sampling frequency of the j-th audio data Dj is 32 kHz and a difference between the second value and the first value is 64 dB, a length of the j-th gain change section $T_j$ is 64 dB/0.5 dB/32 kHz=4 ms.

For example, when a sample step is set to 255 and a gain step is set to 0.25 dB for the j-th input channel in the gain change section setting table 63, the gain setting circuit 50 transitions the j-th gain Gj from the first value by 0.25 dB in a stepwise manner for every 255 samples of the j-th audio data Dj until the j-th gain Gj reaches the second value. In this case, for example, when the sampling frequency of the j-th audio data Dj is 32 kHz and a difference between the second value and the first value is 64 dB, a length of the j-th gain change section $T_j$ is 64 dB/0.25 dB/32 kHz×255=2040 ms.

For example, when a sample step is set to 0 for the j-th input channel in the gain change section setting table 63, a length of the j-th gain change section $T_j$ is 0, and thus the gain setting circuit 50 immediately transitions the j-th gain Gj from the first value to the second value.

Figure 2:
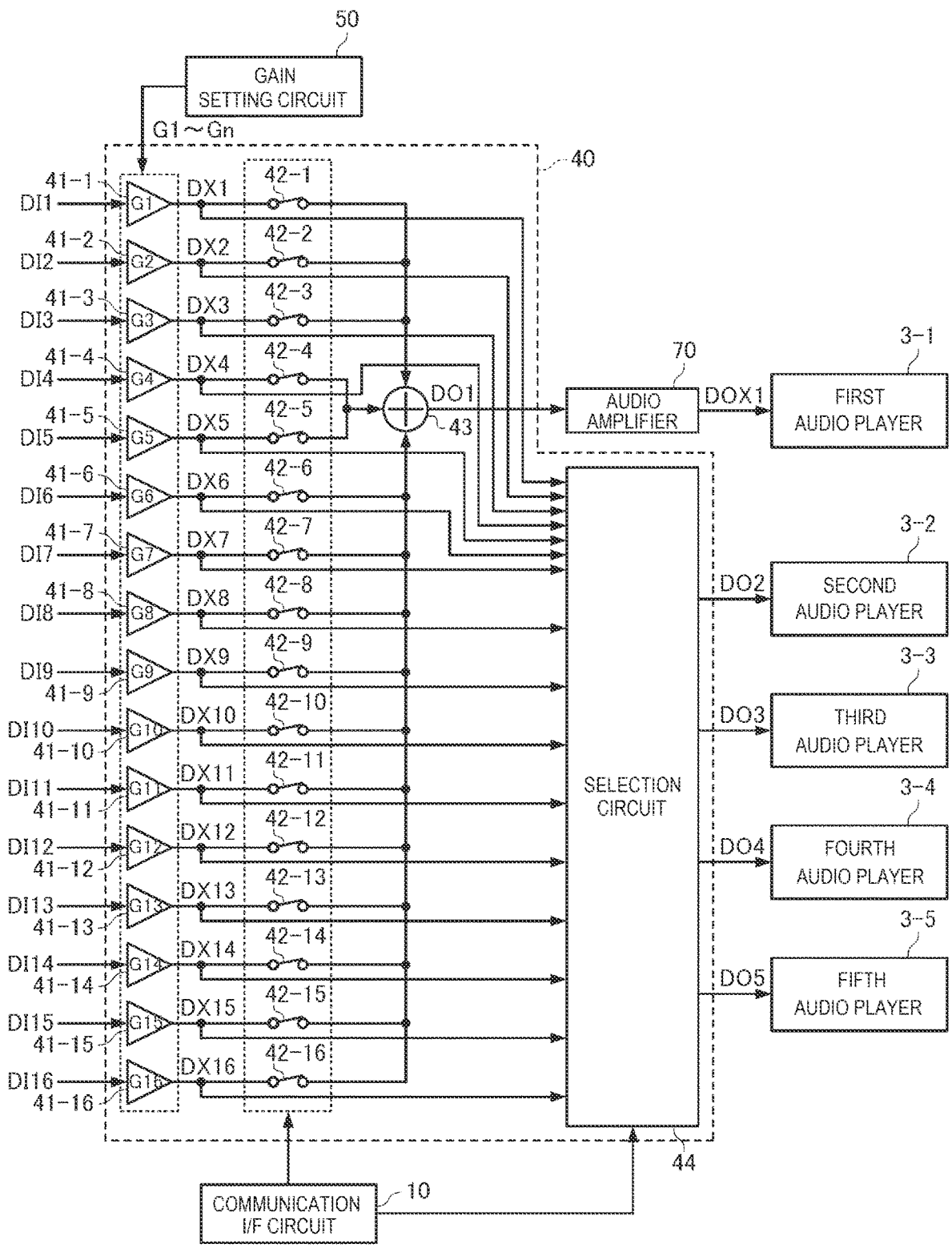
FIG. 2 is a diagram showing a specific configuration example of a mixing circuit.

FIG. 2 is a diagram showing a specific configuration example of the mixing circuit 40. In the example of FIG. 2, the mixing circuit 40 includes 16 input channels and five output channels. That is, FIG. 2 shows an example in which the integer n in FIG. 1 is 16 and the integer m is 5.

In the example of FIG. 2, the mixing circuit 40 includes 16 multipliers 41-1 to 41-16, 16 switch circuits 42-1 to 42-16, an adder 43, and a selection circuit 44.

The i-th audio data DIi of the first to 16th audio data DI1 to DI16 is input to the i-th input channel of the first to 16th input channels, and the i-th gain Gi of the first to 16th gains G1 to G16 is set by the gain setting circuit 50. The i-th input channel is provided with the multiplier 41-i of the multipliers 41-1 to 41-16, and the multiplier 41-i outputs the i-th multiplication data DXi obtained by multiplying the i-th audio data DIi by the i-th gain Gi.

The switch circuit 42-i of the switch circuits 42-1 to 42-16 switches whether to output the i-th multiplication data DXi to the adder 43. The switch circuits 42-1 to 42-16 are switched according to control signals output from the communication interface circuit 10. That is, the micro-control unit 2 can set whether to output the first to 16th multiplication data DX1 to DX16 to the adder 43 by outputting predetermined commands to the audio mixing device 1.

The first to 16th multiplication data DX1 to DX16 are input to the adder 43 via the switch circuits 42-1 to 42-16. That is, for each integer i of 1 or more and 16 or less, when the switch circuit 42-i is in a conductive state, the i-th multiplication data DXi is input to the adder 43, and when the switch circuit 42-i is in a non-conductive state, the i-th multiplication data DXi is not input to the adder 43. The adder 43 outputs the mixing signal DO1 obtained by adding all pieces of input multiplication data among the first to 16th multiplication data DX1 to DX16.

The mixing signal DO1 output from the adder 43 is output from the first output channel to the audio amplifier 70, and the audio amplifier 70 converts the mixing signal DO1 into an audio signal DOX1 and outputs the audio signal DOX1 to the first audio player 3-1. Accordingly, audio corresponding to the audio signal DOX1 is output from the first audio player 3-1.

The selection circuit 44 selects any one of the first to 16th multiplication data DX1 to DX16 and outputs the selected multiplication data as an audio signal DO2 from the second output channel to the second audio player 3-2, or outputs a silent audio signal DO2 to the second audio player 3-2 without selecting any one of the first to 16th multiplication data DX1 to DX16. In the former case, audio corresponding to the audio signal DO2 is output from the second audio player 3-2.

The selection circuit 44 selects any one of the first to 16th multiplication data DX1 to DX16 and outputs the selected multiplication data as an audio signal DO3 from the third output channel to the third audio player 3-3, or outputs a silent audio signal DO3 to the third audio player 3-3 without selecting any one of the first to 16th multiplication data DX1 to DX16. In the former case, audio corresponding to the audio signal DO3 is output from the third audio player 3-3.

The selection circuit 44 selects any one of the first to 16th multiplication data DX1 to DX16 and outputs the selected multiplication data as an audio signal DO4 from the fourth output channel to the fourth audio player 3-4, or outputs a silent audio signal DO4 to the fourth audio player 3-4 without selecting any one of the first to 16th multiplication data DX1 to DX16. In the former case, audio corresponding to the audio signal DO4 is output from the fourth audio player 3-4.

The selection circuit 44 selects any one of the first to 16th multiplication data DX1 to DX16 and outputs the selected multiplication data as an audio signal DO5 from the fifth output channel to the fifth audio player 3-5, or outputs a silent audio signal DO5 to the fifth audio player 3-5 without selecting any one of the first to 16th multiplication data DX1 to DX16. In the former case, audio corresponding to the audio signal DO5 is output from the fifth audio player 3-5.

The selection circuit 44 selects whether to output the first to 16th multiplication data DX1 to DX16 as the audio signals DO2 to DO5 according to control signals output from the communication interface circuit 10. That is, the micro-control unit 2 can set whether to output the first to 16th multiplication data DX1 to DX16 as the audio signals DO2 to DO5 by outputting predetermined commands to the audio mixing device 1.

Figure 3:
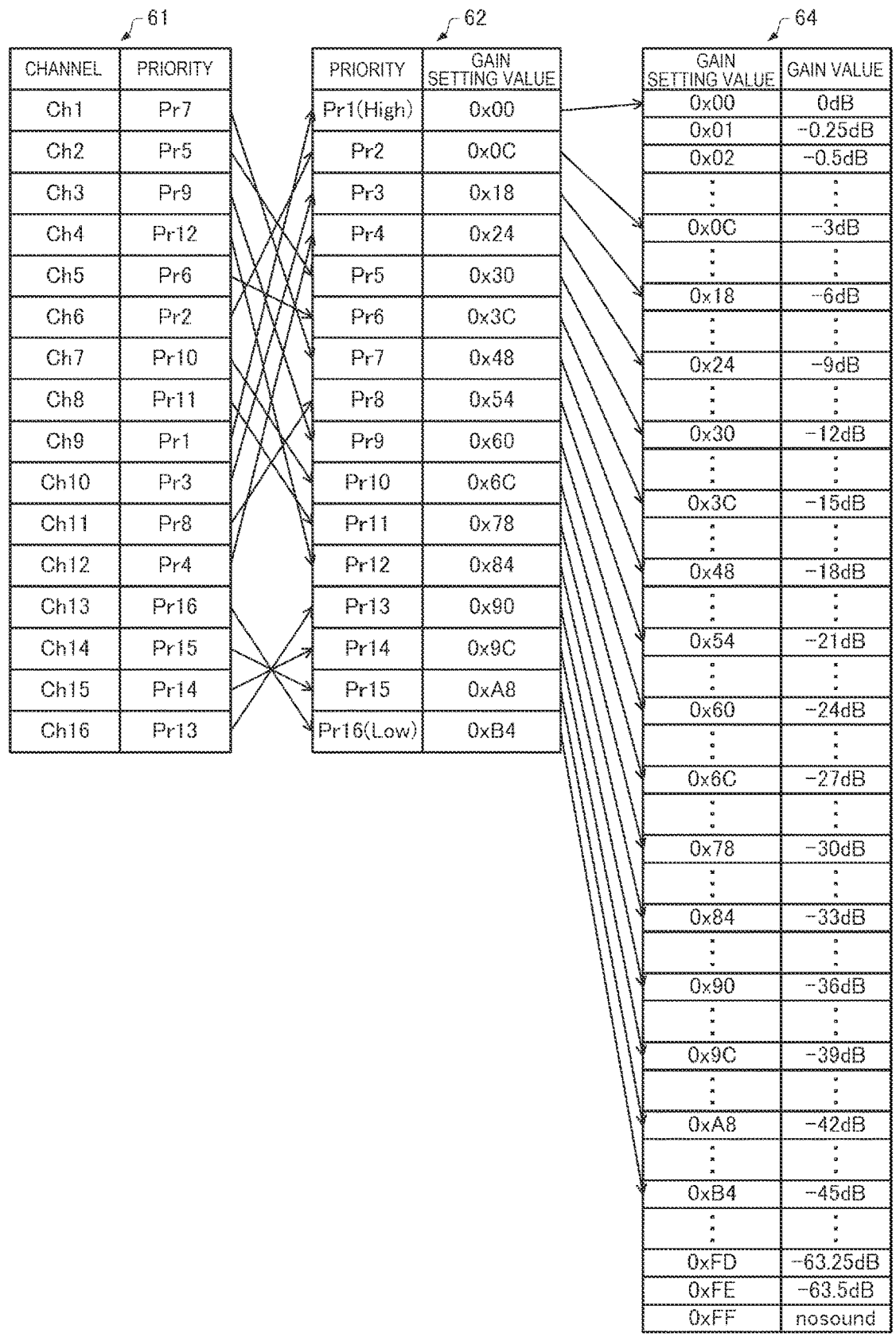
FIG. 3 is a diagram showing an example of a channel-priority setting table, a priority-gain setting table, and a gain reference table.

FIG. 3 is a diagram showing an example of the channel-priority setting table 61, the priority-gain setting table 62, and the gain reference table 64 when the mixing circuit 40 has a configuration as shown in FIG. 2. In FIG. 3, Ch1 to Ch16 are the first to 16th input channels of the mixing circuit 40, respectively.

In the example of FIG. 3, in the channel-priority setting table 61, a priority Pr7 is associated with the first input channel, a priority Pr5 is associated with the second input channel, a priority Pr9 is associated with the third input channel, a priority Pr12 is associated with the fourth input channel, a priority Pr6 is associated with the fifth input channel, and a priority Pr2 is associated with the sixth input channel. A priority Pr10 is associated with the seventh input channel, a priority Pr11 is associated with the eighth input channel, a priority Pr1 is associated with the ninth input channel, a priority Pr3 is associated with the tenth input channel, a priority Pr8 is associated with the eleventh input channel, and a priority Pr4 is associated with the 12th input channel. A priority Pr16 is associated with the 13th input channel, a priority Pr15 is associated with the 14th input channel, a priority Pr14 is associated with the 15th input channel, and a priority Pr13 is associated with the 16th input channel. Among the priorities Pr1 to Pr16, Pri represents an i-th highest priority. That is, since the priority Pr1 is the highest and the priority Pr16 is the lowest, priorities are assigned to the ninth input channel, the sixth input channel, the tenth input channel, the 12th input channel, the second input channel, the fifth input channel, the first input channel, the eleventh input channel, the third input channel, the seventh input channel, the eighth input channel, the fourth input channel, the 16th input channel, the 15th input channel, the 14th input channel, and the 13th input channel in descending order.

In the example of FIG. 3, in the priority-gain setting table 62, the priority Pr1 is associated with a gain setting value 0x00, the priority Pr2 is associated with a gain setting value 0x0C, the priority Pr3 is associated with a gain setting value 0x18, the priority Pr4 is associated with a gain setting value 0x24, the priority Pr5 is associated with a gain setting value 0x30, and the priority Pr6 is associated with a gain setting value 0x3C. The priority Pr7 is associated with a gain setting value 0x48, the priority Pr8 is associated with a gain setting value 0x54, the priority Pr9 is associated with a gain setting value 0x60, the priority Pr10 is associated with a gain setting value 0x6C, the priority Pr11 is associated with a gain setting value 0x78, and the priority Pr12 is associated with a gain setting value 0x84. The priority Pr13 is associated with a gain setting value 0x90, the priority Pr14 is associated with a gain setting value 0x9C, the priority Pr15 is associated with a gain setting value 0xA8, and the priority Pr16 is associated with a gain setting value 0xB4.

In the example of FIG. 3, in the gain reference table 64, a gain value of 0 dB is associated with the gain setting value 0x00, gain values of −0.25 dB to −63.5 dB are respectively associated with the gain setting values 0x01 to 0xFE in increments of −0.25 dB, and "nosound" is associated with the gain setting value 0xFF. Here, "nosound" corresponds to a gain value of −∞ dB.

The priorities Pr1 to Pr16 in the channel-priority setting table 61 are respectively linked to the priorities Pr1 to Pr16 in the priority-gain setting table 62, and the gain setting values in the priority-gain setting table 62 are respectively linked to the gain setting values in the gain reference table 64. Therefore, a gain value of −18 dB corresponding to the gain setting value 0x48 is associated with the first input channel of the priority Pr7, a gain value of −12 dB corresponding to the gain setting value 0x30 is associated with the second input channel of the priority Pr5, a gain value of −24 dB corresponding to the gain setting value 0x60 is associated with the third input channel of the priority Pr9, and a gain value of −33 dB corresponding to the gain setting value 0x84 is associated with the fourth input channel of the priority Pr12. A gain value of −15 dB corresponding to the gain setting value 0x3C is associated with the fifth input channel of the priority Pr6, a gain value of −3 dB corresponding to the gain setting value 0x0C is associated with the sixth input channel of the priority Pr2, a gain value of −27 dB corresponding to the gain setting value 0x6C is associated with the seventh input channel of the priority Pr10, and a gain value of −30 dB corresponding to the gain setting value 0x78 is associated with the eighth input channel of the priority Pr11. A gain value of 0 dB corresponding to the gain setting value 0x00 is associated with the ninth input channel of the priority Pr1, a gain value of −6 dB corresponding to the gain setting value 0x18 is associated with the tenth input channel of the priority Pr3, a gain value of −21 dB corresponding to the gain setting value 0x54 is associated with the eleventh input channel of the priority Pr8, and a gain value of −9 dB corresponding to the gain setting value 0x24 is associated with the 12th input channel of the priority Pr4. A gain value of −45 dB corresponding to the gain setting value 0xB4 is associated with the 13th input channel of the priority Pr16, a gain value of −42 dB corresponding to the gain setting value 0xA8 is associated with the 14th input channel of the priority Pr15, a gain value of −39 dB corresponding to the gain setting value 0x9C is associated with the 15th input channel of the priority Pr14, and a gain value of −36 dB corresponding to the gain setting value 0x90 is associated with the 16th input channel of the priority Pr13. That is, according to the channel-priority setting table 61, the priority-gain setting table 62, and the gain reference table 64, gain values of −18 dB, −12 dB, −24 dB, −33 dB, −15 dB, −3 dB, −27 dB, −30 dB, 0 dB, −6 dB, −21 dB, −9 dB, −45 dB, −42 dB, −39 dB, and −36 dB are associated with the first to 16th input channels in this order.

In a period in which the first to 16th audio data DI1 to DI16 are simultaneously played by the first audio player 3-1, the gain setting circuit 50 sets the gain values of −18 dB, −12 dB, −24 dB, −33 dB, −15 dB, −3 dB, −27 dB, −30 dB, 0 dB, −6 dB, −21 dB, −9 dB, −45 dB, −42 dB, −39 dB, and −36 dB, which are associated with the first to 16th gains G1 to G16 according to the channel-priority setting table 61, the priority-gain setting table 62, and the gain reference table 64 as described above. Accordingly, audio is obtained by synthesizing the first to 16th audio data DI1 to DI16 at volumes which are higher as audio data input to an input channel having a higher priority, and the obtained audio is played by the first audio player 3-1.

In a period in which only a part of the first to 16th audio data DI1 to DI16 are simultaneously played by the first audio player 3-1, the gain setting circuit 50 newly sets a priority for an input channel corresponding to each piece of the audio data simultaneously played by the first audio player 3-1. Specifically, the gain setting circuit 50 refers to the channel-priority setting table 61, and resets the respective priorities Pr1, Pr2 . . . in descending order of the priorities for input channels to which audio data simultaneously played by the first audio player 3-1 is input. The respective priorities Pr1, Pr2 . . . that are reset for the input channels are linked to the priorities Pr1, Pr2, . . . of the priority-gain setting table 62 instead of the channel-priority setting table 61 by the gain setting circuit 50, and the gain setting circuit 50 sets gain values associated with gains corresponding to the input channels according to the priority-gain setting table 62 and the gain reference table 64.

In a period in which the i-th audio data DIi of the first to 16th audio data DI1 to DI16 is not played by the first audio player 3-1 and is played by any one of the second to fifth audio players 3-2 to 3-5, the gain setting circuit 50 may set a gain value of 0 dB corresponding to the gain setting value 0x00 associated with the highest priority Pr1 for the i-th gain Gi.

Figure 4:
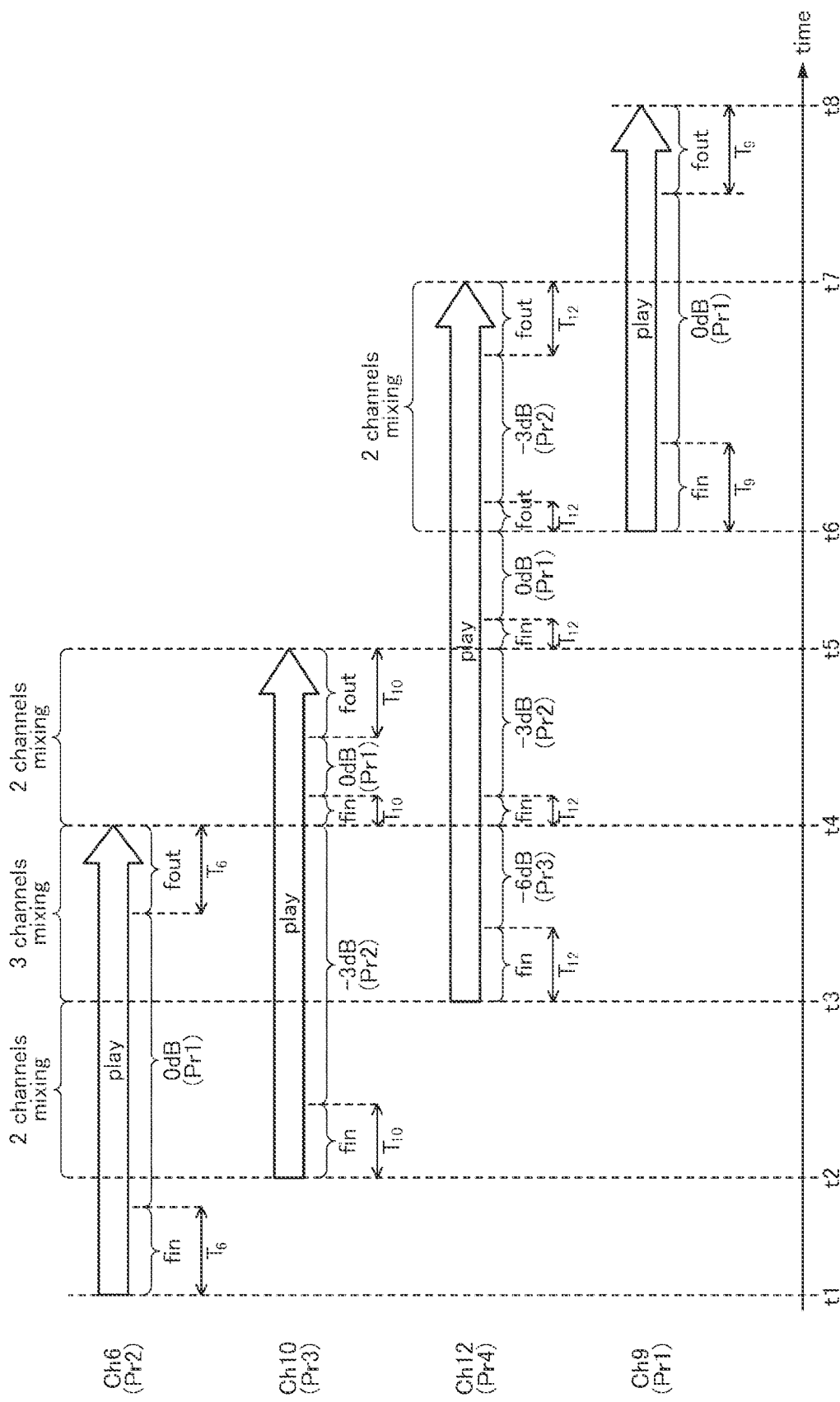
FIG. 4 is a diagram showing a specific example in which a plurality of pieces of audio data are simultaneously played by a first audio player.

FIG. 4 shows a specific example in which a plurality of pieces of audio data are simultaneously played by the first audio player 3-1 when the channel-priority setting table 61, the priority-gain setting table 62, and the gain reference table 64 have configurations as shown in FIG. 3. In FIG. 4, Ch6, Ch9, Ch10, and Ch12 are the sixth input channel, the ninth input channel, the tenth input channel, and the 12th input channel of the mixing circuit 40, respectively.

In the example of FIG. 4, at a time t1, play of the sixth audio data DI6 input to the sixth input channel is started. In a period from the time t1 to a time t2, since the audio data played by the first audio player 3-1 is only the sixth audio data DI6, the gain setting circuit 50 resets the sixth input channel to the highest priority Pr1. The gain setting circuit 50 sets a gain value of 0 dB corresponding to the gain setting value 0x00 associated with the priority Pr1 for the sixth gain G6. Specifically, the gain setting circuit 50 transitions the sixth gain G6 in a stepwise manner from a first value corresponding to a silent gain value of 0 to a second value corresponding to a gain value of 0 dB in the sixth gain change section $T_6$ starting at the time t1. In the sixth gain change section $T_6$, a volume of the sixth audio data DI6 increases in a stepwise manner and reaches a constant value. A phenomenon in which the volume increases in a stepwise manner and reaches a constant value is referred to as "fade in".

Next, at the time t2, play of the tenth audio data DI10 input to the tenth input channel is started. Accordingly, in a period from the time t2 to a time t3, the sixth audio data DI6 and the tenth audio data DI10 are simultaneously played by the first audio player 3-1. Since the priority Pr2 associated with the sixth input channel is higher than the priority Pr3 associated with the tenth input channel, the gain setting circuit 50 resets the sixth input channel to the highest priority Pr1 and resets to the seventh input channel to the second highest priority Pr2. The gain setting circuit 50 sets a gain value of 0 dB corresponding to the gain setting value 0x00 associated with the priority Pr1 for the sixth gain G6, and sets a gain value of −3 dB corresponding to the gain setting value 0x0C associated with the priority Pr2 for the tenth gain G10. Specifically, the gain setting circuit 50 maintains the sixth gain G6 at a value corresponding to the gain value of 0 dB, and transitions the tenth gain G10 in a stepwise manner from the first value corresponding to the silent gain value of 0 to the second value corresponding to the gain value of −3 dB in the tenth gain change section $T_{10}$ starting at the time t2. In the tenth gain change section $T_{10}$, a volume of the tenth audio data DI10 increases in a stepwise manner and reaches a constant value.

At the time t3, play of the 12th audio data DI12 input to the 12th input channel is started. Accordingly, in a period from the time t3 to a time t4, the sixth audio data D16, the tenth audio data DI10, and the 12th audio data D112 are simultaneously played by the first audio player 3-1. Since the priority Pr2 associated with the sixth input channel is higher than the priority Pr3 associated with the tenth input channel and the priority Pr4 associated with the 12th input channel, and the priority Pr3 associated with the tenth input channel is higher than the priority Pr4 associated with the 12th input channel, the gain setting circuit 50 resets the sixth input channel to the highest priority Pr1, resets the tenth input channel to the second highest priority Pr2, and resets the 12th input channel to the third highest priority Pr3. The gain setting circuit 50 sets a gain value of 0 dB corresponding to the gain setting value 0x00 associated with the priority Pr1 for the sixth gain G6, sets a gain value of −3 dB corresponding to the gain setting value 0x0C associated with the priority Pr2 to the tenth gain G10, and sets a gain value of −6 dB corresponding to the gain setting value 0x18 associated with the priority Pr3 for the 12th gain G12. Specifically, the gain setting circuit 50 maintains the sixth gain G6 and the tenth gain G10 respectively at a value corresponding to the gain value of 0 dB and a value corresponding to the gain value of −3 dB, and transitions the 12th gain G12 in a stepwise manner from a first value corresponding to a silent gain value of 0 to a second value corresponding to a gain value of −6 dB in the 12th gain change section $T_{12}$ starting at the time t3. In the 12th gain change section $T_{12}$, a volume of the 12th audio data DI12 increases in a stepwise manner and reaches a constant value.

Next, the gain setting circuit 50 transitions the sixth gain G6 in a stepwise manner from a first value corresponding to a gain value of 0 dB to a second value corresponding to a silent gain value of 0 in the sixth gain change section 16 that ends at the time t4. In the sixth gain change section 16, a volume of the sixth audio data DI6 decreases in a stepwise manner and reaches a constant value of 0. A phenomenon in which the volume decreases in a stepwise manner and reaches a constant value is referred to as "fade out".

That is, at the time t4, the play of the sixth audio data DI6 is stopped. Accordingly, in a period from the time t4 to a time t5, the tenth audio data DI10 and the 12th audio data DI12 are simultaneously played by the first audio player 3-1. Since the priority Pr3 associated with the tenth input channel is higher than the priority Pr4 associated with the 12th input channel, the gain setting circuit 50 resets the tenth input channel to the highest priority Pr1 and resets the 12th input channel to the second highest priority Pr2. The gain setting circuit 50 sets a gain value of 0 dB corresponding to the gain setting value 0x00 associated with the priority Pr1 for the tenth gain G10, and sets a gain value of −3 dB corresponding to the gain setting value OxOC associated with the priority Pr2 for the 12th gain G12. Specifically, the gain setting circuit 50 transitions the tenth gain G10 in a stepwise manner from a first value corresponding to a gain value of −3 dB to a second value corresponding to a gain value of 0 dB in the tenth gain change section Two starting at the time t4. In the tenth gain change section Two, a volume of the tenth audio data DI10 increases in a stepwise manner and reaches a constant value. In the 12th gain change section 112 starting at the time t4, the gain setting circuit 50 transitions the 12th gain G12 in a stepwise manner from a first value corresponding to a gain value of −6 dB to a second value corresponding to a gain value of −3 dB. In the 12th gain change section $T_{12}$, a volume of the 12th audio data DI12 increases in a stepwise manner and reaches a constant value.

Next, the gain setting circuit 50 transitions the tenth gain G10 in a stepwise manner from a first value corresponding to a gain value of 0 dB to a second value corresponding to a silent gain value of 0 in the tenth gain change section Two that ends at the time t5. In the tenth gain change section Two, a volume of the tenth audio data DI10 decreases in a stepwise manner and reaches 0.

That is, at the time t5, the play of the tenth audio data DI10 is stopped. Accordingly, in a period from the time t5 to a time t6, since the audio data played by the first audio player 3-1 is only the 12th audio data DI12, the gain setting circuit 50 resets the 12th input channel to the highest priority Pr1. The gain setting circuit 50 sets a gain value of 0 dB corresponding to the gain setting value 0x00 associated with the priority Pr1 for the 12th gain G12. Specifically, the gain setting circuit 50 transitions the 12th gain G12 in a stepwise manner from a first value corresponding to a gain value of −3 dB to a second value corresponding to a gain value of 0 dB in the 12th gain change section $T_{12}$ starting at the time t5. In the 12th gain change section $T_{12}$, a volume of the 12th audio data DI12 increases in a stepwise manner and reaches a constant value.

Next, at the time t6, play of the ninth audio data DI9 input to the ninth input channel is started. Accordingly, in a period from the time t6 to a time t7, the 12th audio data DI12 and the ninth audio data DI9 are simultaneously played by the first audio player 3-1. Since the priority Pr1 associated with the ninth input channel is higher than the priority Pr4 associated with the 12th input channel, the gain setting circuit 50 resets the ninth input channel to the highest priority Pr1 and resets the 12th input channel to the second highest priority Pr2. The gain setting circuit 50 sets a gain value of 0 dB corresponding to the gain setting value 0x00 associated with the priority Pr1 for the ninth gain G9, and sets a gain value of −3 dB corresponding to the gain setting value 0x0C associated with the priority Pr2 for the 12th gain G12. Specifically, the gain setting circuit 50 transitions the ninth gain G9 in a stepwise manner from a first value corresponding to a silent gain value of 0 to a second value corresponding to a gain value of 0 dB in the ninth gain change section $T_9$ starting at the time t6. In the ninth gain change section $T_9$, a volume of the ninth audio data DI9 increases in a stepwise manner and reaches a constant value. In the 12th gain change section $T_{12}$ starting at the time t6, the gain setting circuit 50 transitions the 12th gain G12 in a stepwise manner from a first value corresponding to a gain value of 0 dB to a second value corresponding to a gain value of −3 dB. In the 12th gain change section $T_{12}$, a volume of the 12th audio data DI12 decreases in a stepwise manner and reaches a constant value.

Next, the gain setting circuit 50 transitions the 12th gain G12 in a stepwise manner from a first value corresponding to a gain value of −3 dB to a second value corresponding to a silent gain value of 0 in the 12th gain change section $T_{12}$ that ends at the time t7. In the 12th gain change section $T_{12}$, a volume of the 12th audio data DI12 decreases in a stepwise manner and reaches 0.

That is, at the time t7, the play of the 12th audio data DI12 is stopped. Accordingly, in a period from the time t7 to a time t8, since the audio data played by the first audio player 3-1 is only the ninth audio data DI9, the gain setting circuit 50 resets the ninth input channel to the highest priority Pr1. The gain setting circuit 50 sets the gain value of 0 dB corresponding to the gain setting value 0x00 associated with the priority Pr1 for the ninth gain G9. Specifically, the gain setting circuit 50 maintains the ninth gain G9 at a value corresponding to a gain value of 0 dB.

Next, the gain setting circuit 50 transitions the ninth gain G9 in a stepwise manner from a first value corresponding to a gain value of 0 dB to a second value corresponding to a silent gain value of 0 in the ninth gain change section $T_9$ that ends at the time t8. In the ninth gain change section $T_9$, a volume of the ninth audio data DI9 decreases in a stepwise manner and reaches 0. That is, at the time t8, the play of the ninth audio data DI9 is stopped.

Figure 5:
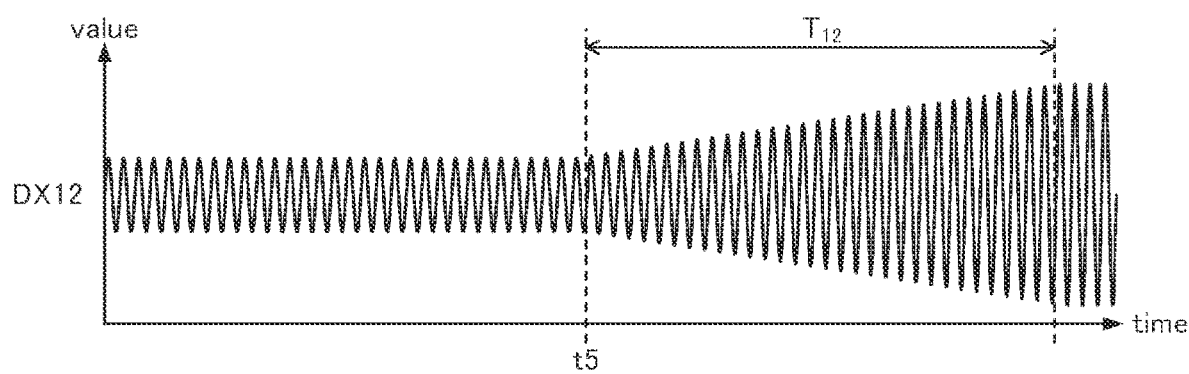
FIG. 5 is a diagram showing an example of a waveform of an audio signal when a gain is increased.
Figure 6:
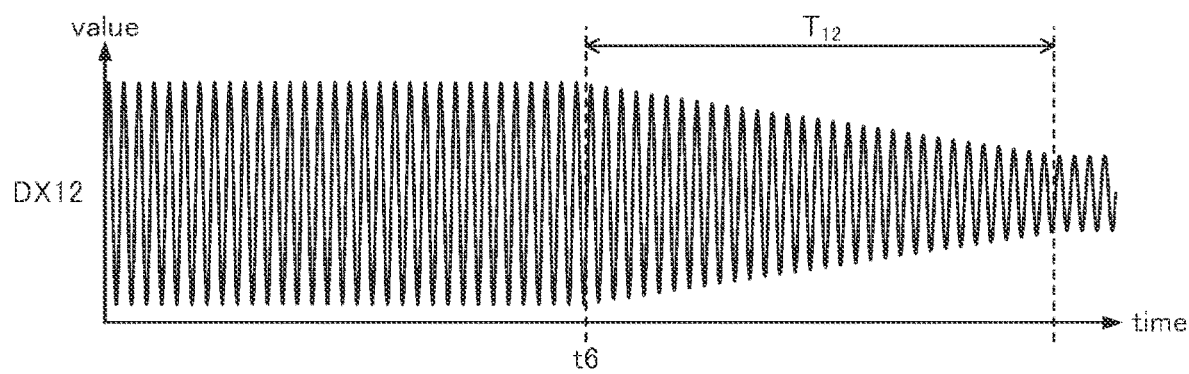
FIG. 6 is a diagram showing an example of a waveform of the audio signal when a gain is reduced.

As an example of the fade in, FIG. 5 shows a waveform of the 12th multiplication data DX12 before and after the 12th gain change section 112 starting at the time t5 in FIG. 4. As an example of the fade out, FIG. 6 shows a waveform of the 12th multiplication data DX12 before and after the 12th gain change section $T_{12}$ starting at the time t6 in FIG. 4. As described above, the 12th multiplication data DX12 is data obtained by multiplying the 12th audio data DI12 by the 12th gain G12. In the examples of FIGS. 5 and 6, the 12th audio data DI12 is sinusoidal data having a constant amplitude. In the example of FIG. 5, since the 12th gain G12 increases in a stepwise manner in the 12th gain change section $T_{12}$, the amplitude of the 12th multiplication data DX12 also increases in a stepwise manner. On the other hand, in the example of FIG. 6, since the 12th gain G12 decreases in a stepwise manner in the 12th gain change section $T_{12}$, the amplitude of the 12th multiplication data DX12 also decreases in a stepwise manner.

In the audio mixing device 1 according to the first embodiment described above, the gain setting circuit 50 sets the first to n-th gains G1 to Gn based on a command input from the external micro-control unit 2, the mixing circuit 40 outputs the mixing signal DO1 obtained by mixing two or more of the first to n-th multiplication data DX1 to DXn obtained by respectively multiplying the first to n-th audio data DI1 to DIn by the first to n-th gains G1 to Gn, and the audio amplifier 70 converts the mixing signal DO1 into the audio signal DO1X and outputs the audio signal DO1X to the first audio player 3-1. Therefore, according to the audio mixing device 1 of the first embodiment, the first audio player 3-1 can play a plurality of pieces of audio data of the first to n-th audio data DI1 to DIn which is requested to be played, without delay.

According to the audio mixing device 1 of the first embodiment, since the gain setting circuit 50 sets the first to n-th gains of the first to n-th gains G1 to Gn instead of the same gain for a plurality of pieces of audio data to be played, a user can easily distinguish a plurality of pieces of audio data to be simultaneously played. In particular, for the plurality of pieces of audio data to be simultaneously played, the gain setting circuit 50 sets a higher gain for audio data having a higher priority, so that the user can easily hear the audio data having a higher priority.

In the audio mixing device 1 according to the first embodiment, during play of the j-th audio data DIj with the first value being set for the j-th gain Gj, the gain setting circuit 50 sets the j-th gain Gj to the second value different from the first value when the play of the k-th audio data DIk having a higher priority than the j-th audio data DIj is started or stopped. Therefore, according to the audio mixing device 1 of the first embodiment, when the priority of the j-th audio data DIj during play increases or decreases, a play volume of the j-th audio data can be appropriately changed.

Further, in the audio mixing device 1 of the first embodiment, since the gain setting circuit 50 transitions setting values of the first to n-th gains G1 to Gn in a stepwise manner, the first to n-th multiplication data DX1 to DXn also transition in a stepwise manner. According to the audio mixing device 1 of the first embodiment, when the first audio player 3-1 plays audio based on the mixing signal DO1 obtained by mixing two or more of the first to n-th multiplication data DX1 to DXn, a sudden volume change is less likely to occur, and generation of an abnormal sound is prevented.

The audio mixing device 1 according to the first embodiment includes the memory 20 configured to store the first to n-th audio source data 21-1 to 21-$n$ that serve as the base of the first to n-th audio data DI1 to DIn. Therefore, according to the audio mixing device 1 of the first embodiment, since it is not necessary to acquire the first to n-th audio source data 21-1 to 21-$n$ from the outside, it is possible to advance a timing when play of the first to n-th audio data DI1 to DIn is started.

1-2. Second Embodiment

Hereinafter, in the audio mixing device 1 according to a second embodiment, the same components as those in the first embodiment will be denoted by the same reference numerals, description similar to that in the first embodiment will be omitted or simplified, and content different from that in the first embodiment will be mainly described.

Figure 7:
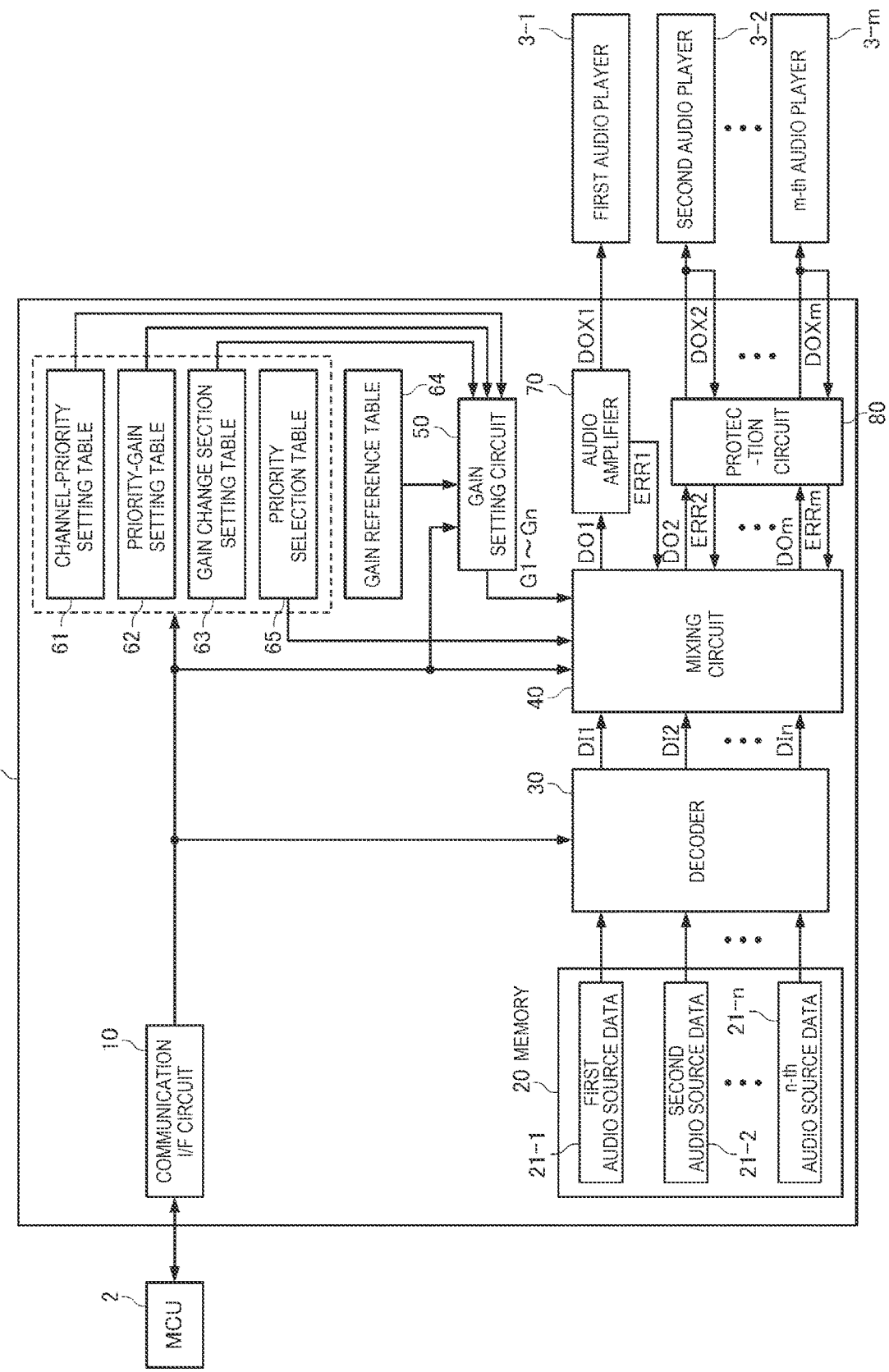
FIG. 7 is a diagram showing a configuration example of an audio mixing device according to a second embodiment.

FIG. 7 is a diagram illustrating a configuration example of the audio mixing device 1 according to the second embodiment. As shown in FIG. 7, the audio mixing device 1 according to the second embodiment includes the communication interface circuit 10, the memory 20, the decoder 30, the mixing circuit 40, the gain setting circuit 50, the channel-priority setting table 61, the priority-gain setting table 62, the gain change section setting table 63, the gain reference table 64, and the audio amplifier 70 in a similar manner to the first embodiment, and further includes a priority selection table 65 and a protection circuit 80. The audio mixing device 1 according to the second embodiment may be a single-chip semiconductor integrated circuit device, or a multi-chip semiconductor integrated circuit device, or at least a part thereof may be implemented by an electronic component other than the semiconductor integrated circuit device.

Since the functions and configurations of the memory 20, the decoder 30, the gain setting circuit 50, the channel-priority setting table 61, the priority-gain setting table 62, the gain change section setting table 63, and the gain reference table 64 are the same as those in the first embodiment, description thereof will be omitted.

Similar to the first embodiment, the communication interface circuit 10 receives, from the micro-control unit 2, an audio play command or an audio stop command for the i-th audio source data 21-i and a data write command for the channel-priority setting table 61, the priority-gain setting table 62, or the gain change section setting table 63, and generates control signals corresponding to the received commands. Further, in the second embodiment, when the communication interface circuit 10 receives a data write command for the priority selection table 65, the communication interface circuit 10 generates a control signal for writing data designated by an address designated by the command.

Similar to the first embodiment, the audio amplifier 70 converts the mixing signal DO1 output from the mixing circuit 40 into the audio signal DOX1 and outputs the audio signal DOX1 to the first audio player 3-1. Further, in the second embodiment, the audio amplifier 70 determines whether the audio signal DOX1 is normal or abnormal, and outputs an abnormality detection signal ERR1 to the mixing circuit 40 when it is determined that the audio signal DOX1 is abnormal.

Similar to the first embodiment, the mixing circuit 40 may output the mixing signal DO1 and further output the audio signals DO2 to DOm to the second to m-th audio players 3-2 to 3-m. Further, in the second embodiment, when the mixing circuit 40 receives the abnormality detection signal ERR1 output from the audio amplifier 70, the mixing circuit 40 outputs the mixing signal DO1 to any one of the second to m-th audio players 3-2 to 3-m. In particular, when the integer m is set to an integer of three or more and the abnormality detection signal ERR1 is input, the mixing circuit 40 selects one of the second to m-th audio players 3-2 to 3-m based on the priority selection table 65, and outputs the mixing signal DO1 to the selected one of the second to m-th audio players 3-2 to 3-m.

The priority selection table 65 is a table in which priorities are set to select an output channel from the second to m-th output channels as an output destination of the mixing signal DO1 when the mixing circuit 40 receives the abnormality detection signal ERR1. The priority selection table 65 is stored in a RAM or a register (not shown), and is rewritten by a command input from the outside of the audio mixing device 1.

For example, when the mixing circuit 40 receives the abnormality detection signal ERR1, the mixing circuit 40 may select the i-th audio player 3-i of the second to m-th audio players 3-2 to 3-m which is designated by a highest priority in the priority selection table 65, and output the mixing signal DO1 to the selected i-th audio player 3-i.

The protection circuit 80 outputs the audio signals DO2 to DOm as the respective audio signals DOX2 to DOXm to the second to m-th audio players 3-2 to 3-m, and determines whether each of the audio signals DOX2 to DOXm is normal or abnormal. The protection circuit 80 outputs abnormality detection signals ERR2 to ERRm to the mixing circuit 40 when it is determined that the audio signals DOX2 to DOXm are abnormal.

For example, when the mixing circuit 40 receives the abnormality detection signal ERR1, in a case where the abnormality detection signal ERRj of the abnormality detection signals ERR2 to ERRm is input, the mixing circuit 40 may output the mixing signal DO1 to a k-th audio player 3-k of the second to m-th audio players 3-2 to 3-m which is designated by a highest priority in the priority selection table 65 except the j-th audio player 3-j.

The audio mixing device 1 may not include the protection circuit 80.

Figure 8:
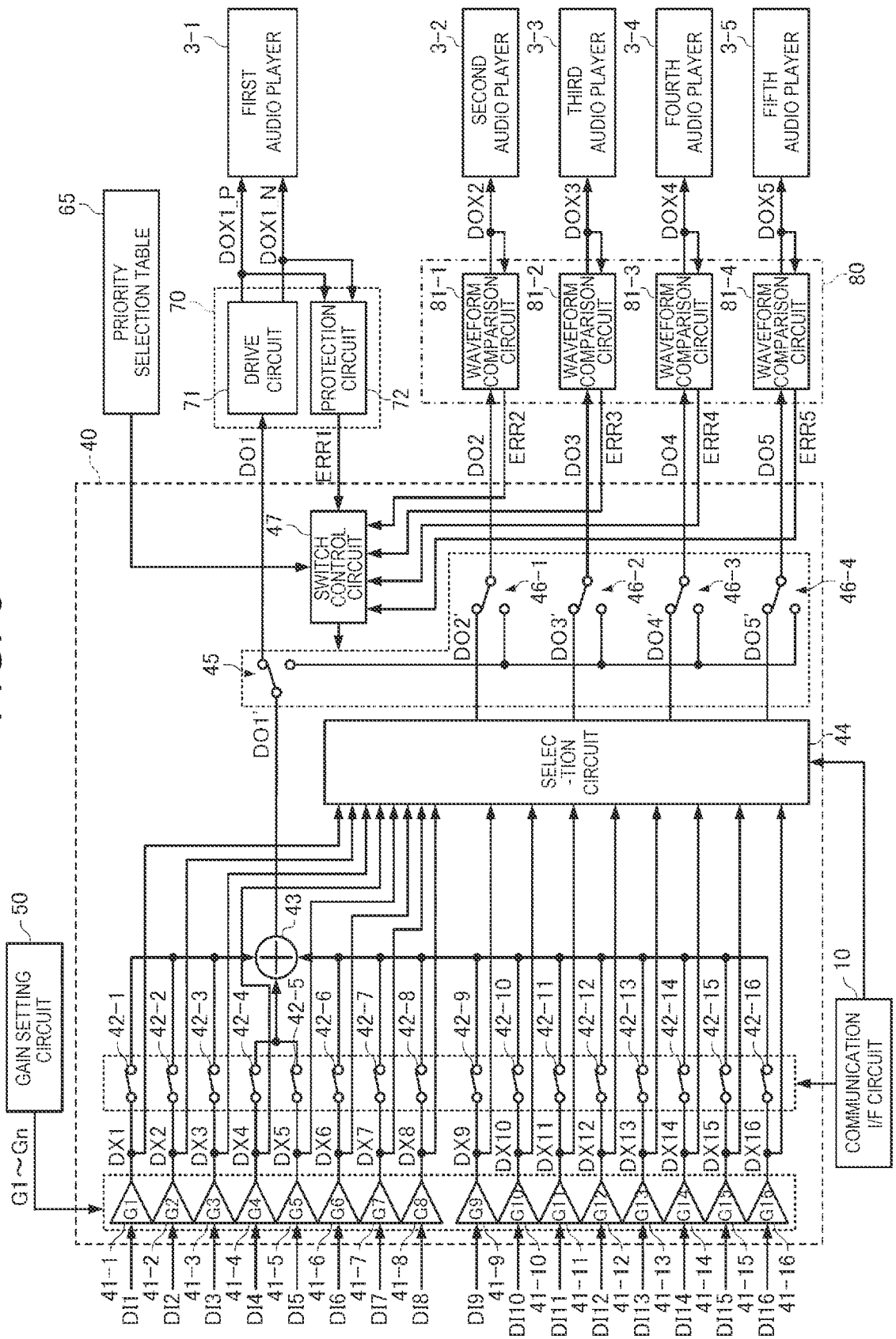
FIG. 8 is a diagram showing a specific configuration example of a mixing circuit, an audio amplifier, and a protection circuit according to the second embodiment.

FIG. 8 is a diagram showing a specific configuration example of the mixing circuit 40, the audio amplifier 70, and the protection circuit 80 according to the second embodiment. In the example of FIG. 8, the mixing circuit 40 includes 16 input channels and five output channels. That is, FIG. 8 shows an example in which the integer n in FIG. 7 is 16 and the integer m is 5.

In the example of FIG. 8, the audio amplifier 70 includes a drive circuit 71 and a protection circuit 72. The drive circuit 71 converts the mixing signal DO1 into the audio signal DOX1 and outputs the audio signal DOX1 to the first audio player 3-1. In the example of FIG. 8, the audio signal DOX1 is differential audio signals DOX1_P and DOX1_N. Accordingly, audio corresponding to the audio signals DOX1_P and DOX1_N is output from the first audio player 3-1.

The protection circuit 72 determines whether the audio signals DOX1_P and DOX1_N are normal or abnormal, and outputs the abnormality detection signal ERR1 to a switch control circuit 47 of the mixing circuit 40 when it is determined that the audio signals DOX1_P and DOX1_N are abnormal. For example, the protection circuit 72 may measure a current flowing through signal lines through which the audio signals DOX1_P and DOX1_N are output or through a signal line inside the drive circuit 71, detect an overcurrent when the measured value is higher than a predetermined value, and output the abnormality detection signal ERR1. The protection circuit 72 may output the abnormality detection signal ERR1 when logical levels of the audio signals DOX1_P and DOX1_N are high for a predetermined time or longer.

The protection circuit 80 includes four waveform comparison circuits 81-1 to 81-4.

The waveform comparison circuit 81-1 outputs the audio signal DO2 as the audio signal DOX2 to the second audio player 3-2. The waveform comparison circuit 81-1 compares a waveform of the audio signal DOX2 with a waveform of the audio signal DO2, determines whether the audio signal DOX2 is normal or abnormal based on a difference between the waveforms, and outputs the abnormality detection signal ERR2 to the switch control circuit 47 of the mixing circuit 40 when it is determined that the audio signal DOX2 is abnormal.

The waveform comparison circuit 81-2 outputs the audio signal DO3 as the audio signal DOX3 to the third audio player 3-3. The waveform comparison circuit 81-2 compares a waveform of the audio signal DOX3 with a waveform of the audio signal DO3, determines whether the audio signal DOX3 is normal or abnormal based on a difference between the waveforms, and outputs the abnormality detection signal ERR3 to the switch control circuit 47 of the mixing circuit 40 when it is determined that the audio signal DOX3 is abnormal.

The waveform comparison circuit 81-3 outputs the audio signal DO4 as the audio signal DOX4 to the fourth audio player 3-4. The waveform comparison circuit 81-3 compares a waveform of the audio signal DOX4 with a waveform of the audio signal DO4, determines whether the audio signal DOX4 is normal or abnormal based on a difference between the waveforms, and outputs the abnormality detection signal ERR4 to the switch control circuit 47 of the mixing circuit 40 when it is determined that the audio signal DOX4 is abnormal.

The waveform comparison circuit 81-4 outputs the audio signal DO5 as the audio signal DOX5 to the fifth audio player 3-5. The waveform comparison circuit 81-4 compares a waveform of the audio signal DOX5 with a waveform of the audio signal DO5, determines whether the audio signal DOX5 is normal or abnormal based on a difference between the waveforms, and outputs the abnormality detection signal ERR5 to the switch control circuit 47 of the mixing circuit 40 when it is determined that the audio signal DOX5 is abnormal.

Similar to FIG. 2, the mixing circuit 40 includes 16 multipliers 41-1 to 41-16, 16 switch circuits 42-1 to 42-16, the adder 43, and the selection circuit 44. Further, in the example of FIG. 8, the mixing circuit 40 includes a switch circuit 45, four switch circuits 46-1 to 46-4, and the switch control circuit 47.

Since the functions and configurations of the multipliers 41-1 to 41-12 and the switch circuits 42-1 to 42-16 are the same as those in FIG. 2, the description thereof will be omitted.

The first to 16th multiplication data DX1 to DX16 are input to the adder 43 via the switch circuits 42-1 to 42-16. The adder 43 outputs a mixing signal DO1' obtained by adding all pieces of input multiplication data among the first to 16th multiplication data DX1 to DX16.

The selection circuit 44 selects any one of the first to 16th multiplication data DX1 to DX16 and outputs the selected multiplication data as an audio signal DO2' from the second output channel to the switch circuit 46-1, or outputs a silent audio signal DO2' to the switch circuit 46-1 without selecting any one of the first to 16th multiplication data DX1 to DX16.

The selection circuit 44 selects any one of the first to 16th multiplication data DX1 to DX16 and outputs the selected multiplication data as an audio signal DO3' from the third output channel to the switch circuit 46-2, or outputs a silent audio signal DO3' to the switch circuit 46-2 without selecting any one of the first to 16th multiplication data DX1 to DX16.

The selection circuit 44 selects any one of the first to 16th multiplication data DX1 to DX16 and outputs the selected multiplication data as an audio signal DO4' from the fourth output channel to the switch circuit 46-3, or outputs a silent audio signal DO4' to the switch circuit 46-3 without selecting any one of the first to 16th multiplication data DX1 to DX16.

The selection circuit 44 selects any one of the first to 16th multiplication data DX1 to DX16 and outputs the selected multiplication data as an audio signal DO5' from the fifth output channel to the switch circuit 46-4, or outputs a silent audio signal DO5' to the switch circuit 46-4 without selecting any one of the first to 16th multiplication data DX1 to DX16.

The selection circuit 44 selects whether to output the first to 16th multiplication data DX1 to DX16 as the audio signals DO2' to DO5' according to control signals output from the communication interface circuit 10. That is, the micro-control unit 2 can set whether to output the first to 16th multiplication data DX1 to DX16 as the audio signals DO2' to DO5' by outputting predetermined commands to the audio mixing device 1.

The switch circuit 45 switches between whether to output the mixing signal DO1' output from the adder 43 as the mixing signal DO1 from the first output channel to the drive circuit 71 of the audio amplifier 70 and whether to output the mixing signal DO1' to the switch circuits 46-1 to 46-4.

The switch circuit 46-1 selects one of the audio signal DO2' and the mixing signal DO1', and outputs the selected signal as the audio signal DO2 from the second output channel to the second audio player 3-2.

The switch circuit 46-2 selects one of the audio signal DO3' and the mixing signal DO1', and outputs the selected signal as the audio signal DO3 from the third output channel to the third audio player 3-3.

The switch circuit 46-3 selects one of the audio signal DO4' and the mixing signal DO1', and outputs the selected signal as the audio signal DO4 from the fourth output channel to the fourth audio player 3-4.

The switch circuit 46-4 selects one of the audio signal DO5' and the mixing signal DO1', and outputs the selected signal as the audio signal DO5 from the fifth output channel to the fifth audio player 3-5.

The switch control circuit 47 controls the switch circuit 45 and the switch circuits 46-1 to 46-4 based on the abnormality detection signals ERR1 to ERR5. Specifically, when the switch control circuit 47 does not receive the abnormality detection signal ERR1, that is, when the audio signal DOX1 output to the first audio player 3-1 is normal, the switch control circuit 47 controls the switch circuit 45 such that the mixing signal DO1' is output from the first output channel as the mixing signal DO1, and controls the switch circuits 46-1 to 46-4 such that the audio signals DO2' to DO5' are output from the second to fifth output channels as the respective audio signals DO2 to DO5.

When the switch control circuit 47 receives the abnormality detection signal ERR1, that is, when the audio signal DOX1 output to the first audio player 3-1 is abnormal, the switch control circuit 47 controls the switch circuit 45 such that the mixing signal DO1' is output to the switch circuits 46-1 to 46-4, and controls the switch circuits 46-1 to 46-4 such that the mixing signal DO1' is output from any one of the second to fifth output channels based on the abnormality detection signals ERR2 to ERR5 and the priority selection table 65. Specifically, when the switch control circuit 47 receives the abnormality detection signal ERR1, the switch control circuit 47 refers to the priority selection table 65, specifies the i-th output channel which has the highest priority among one or more output channels that do not receive corresponding abnormality detection signals, and controls the switch circuits 45, 46-1 to 46-4 such that the mixing signal DO1' is output from the i-th output channel.

Figure 9:
FIG. 9 is a diagram showing an example of a priority selection table.

FIG. 9 is a diagram showing an example of the priority selection table 65 when the mixing circuit 40 has a configuration as shown in FIG. 8. In FIG. 9, Ch2 to Ch5 are the second to fifth output channels of the mixing circuit 40, respectively. In the example of FIG. 9, in the priority selection table 65, the highest priority Pr1 is associated with the second output channel, the second highest priority Pr2 is associated with the third output channel, the third highest priority Pr3 is associated with the fourth output channel, and the lowest priority Pr4 is associated with the fifth input channel.

In the example of FIG. 9, in a case where the abnormality detection signal ERR1 is input when audio corresponding to the mixing signal DO1' is played by the first audio player 3-1, if the abnormality detection signal ERR2 is not input, that is, if the audio signal DOX1 is abnormal and the audio signal DOX2 is normal, the switch control circuit 47 switches the switch circuits 45 and 46-1 such that the mixing signal DO1' is output from the second output channel. Accordingly, audio played by the first audio player 3-1 is stopped, and the audio corresponding to the mixing signal DO1' is played by the second audio player 3-2.

In a case where the abnormality detection signal ERR1 is input when the audio corresponding to the mixing signal DO1' is played by the first audio player 3-1, if the abnormality detection signal ERR2 is input and the abnormality detection signal ERR3 is not input, that is, when the audio signals DOX1 and DOX2 are abnormal and the audio signal DOX3 is normal, the switch control circuit 47 switches the switch circuits 45 and 46-2 such that the mixing signal DO1' is output from the third output channel. Accordingly, audio played by the first audio player 3-1 is stopped, and the audio corresponding to the mixing signal DO1' is played by the third audio player 3-3.

In a case where the abnormality detection signal ERR1 is input when the audio corresponding to the mixing signal DO1' is played by the first audio player 3-1, if the abnormality detection signals ERR2 and ERR3 are input and the abnormality detection signal ERR4 is not input, that is, when the audio signals DOX1, DOX2, and DOX3 are abnormal and the audio signal DOX4 is normal, the switch control circuit 47 switches the switch circuits 45 and 46-3 such that the mixing signal DO1' is output from the fourth output channel. Accordingly, audio played by the first audio player 3-1 is stopped, and the audio corresponding to the mixing signal DO1' is played by the fourth audio player 3-4.

In a case where the abnormality detection signal ERR1 is input when the audio corresponding to the mixing signal DO1' is played by the first audio player 3-1, if the abnormality detection signals ERR2, ERR3, and ERR4 are input and the abnormality detection signal ERR5 is not input, that is, when the audio signals DOX1, DOX2, DOX3, and DOX4 are abnormal and the audio signal DOX5 is normal, the switch control circuit 47 switches the switch circuits 45 and 46-4 such that the mixing signal DO1' is output from the fifth output channel. Accordingly, audio played by the first audio player 3-1 is stopped, and the audio corresponding to the mixing signal DO1' is played by the fifth audio player 3-5.

According to the audio mixing device 1 of the second embodiment described above, the same effects as those of the audio mixing device 1 according to the first embodiment are achieved. Further, in the audio mixing device 1 according to the second embodiment, when it is determined that the audio signal DOX1 is abnormal, the audio amplifier 70 outputs the abnormality detection signal ERR1 to the mixing circuit 40, and when the abnormality detection signal ERR1 is input, the mixing circuit 40 outputs the mixing signal DO1' to any one of the second to m-th audio players 3-2 to 3-m. Specifically, when the abnormality detection signal ERR1 is input, the mixing circuit 40 selects one of the second to m-th audio players 3-2 to 3-m which has the highest priority and can be played based on the priority selection table 65 and the abnormality detection signals ERR2 to ERRm, and outputs the mixing signal DO1'. Therefore, according to the audio mixing device 1 of the second embodiment, even when an abnormality occurs in the first audio player 3-1 or the audio amplifier 70, one of the second to m-th audio players 3-2 to 3-m can play a plurality of pieces of audio data without delay.

1-3. Third Embodiment

Hereinafter, in the audio mixing device 1 according to a third embodiment, the same components as those in the first embodiment or the second embodiment will be denoted by the same reference numerals, description similar to that in the first embodiment or the second embodiment will be omitted or simplified, and content different from that in the first embodiment or the second embodiment will be mainly described.

Figure 10:
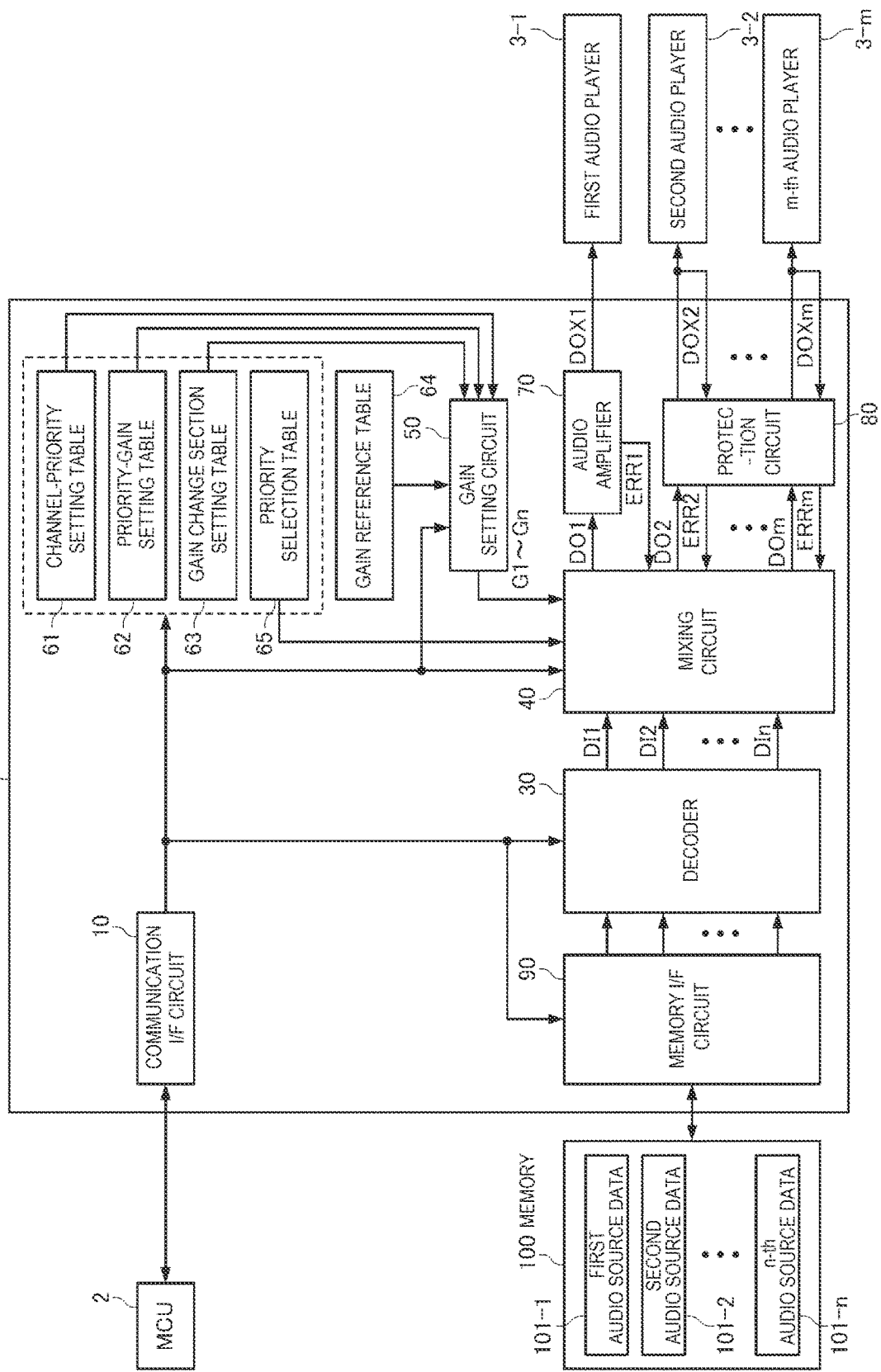
FIG. 10 is a diagram showing a configuration example of an audio mixing device according to a third embodiment.

FIG. 10 is a diagram showing a configuration example of the audio mixing device 1 according to the third embodiment. As shown in FIG. 10, the audio mixing device 1 according to the third embodiment includes a memory interface circuit 90 instead of the memory 20 as compared with the audio mixing device 1 according to the second embodiment shown in FIG. 7.

The memory interface circuit 90 receives first to n-th audio source data 101-1 to 101-n from an external memory 100 of the audio mixing device 1. The memory interface circuit 90 may be, for example, a QSPI interface circuit. QSPI is an abbreviation for Quad Serial Peripheral Interface.

In response to a control signal that instructs audio play for the i-th audio source data 101-i output from the communication interface circuit 10, the memory interface circuit 90 reads the i-th audio source data 101-i from the memory 100, and outputs the read i-th audio source data 101-i to the i-th input channel of the decoder 30.

The memory 100 stores n pieces of audio source data including the first to n-th audio source data 101-1 to 101-n. That is, the first to n-th audio source data 101-1 to 101-n are stored in the memory 100. The memory 100 may be, for example, a flash memory. The first to n-th audio source data 101-1 to 101-n may be, for example, pulse code modulated (PCM) audio data, or may be adaptive difference pulse code modulated (ADPCM) audio data. The audio data may be, for example, data of various kinds of sounds such as a sound imitating a voice when a person speaks, a mechanical warning sound, and a sound effect.

The decoder 30 decodes the i-th audio source data 101-i of the i-th input channel in response to a control signal that instructs audio play for the i-th audio source data 101-i output from the communication interface circuit 10, and demodulates the i-th audio data DIi. As described above, the first to n-th audio source data 101-1 to 101-n stored in the memory 100 are data that serve as a base of the first to n-th audio data DI1 to DIn.

Other configurations and functions of the audio mixing device 1 according to the third embodiment are the same as those of the audio mixing device 1 according to the second embodiment, and description thereof will be omitted.

The audio mixing device 1 according to the third embodiment may include the memory interface circuit 90 instead of the memory 20 as compared with the audio mixing device 1 according to the first embodiment shown in FIG. 1.

According to the audio mixing device 1 of the third embodiment described above, the same effects as those of the audio mixing device 1 according to the first embodiment or the second embodiment are achieved. Further, the audio mixing device 1 according to the third embodiment includes the memory interface circuit 90 that receives the first to n-th audio source data 101-1 to 101-n from the external memory 100. Therefore, according to the audio mixing device 1 of the third embodiment, since the first to n-th audio source data 101-1 to 101-*n* can be received from the external memory 100 via the memory interface circuit 90, it is not necessary to incorporate a memory for storing the first to n-th audio source data 101-1 to 101-*n*, and a circuit size can be reduced.

1-4. Fourth Embodiment

Hereinafter, in the audio mixing device 1 according to a fourth embodiment, the same components as those in the first embodiment or the second embodiment will be denoted by the same reference numerals, description similar to that in the first embodiment or the second embodiment will be omitted or simplified, and content different from that in the first embodiment or the second embodiment will be mainly described.

Figure 11:
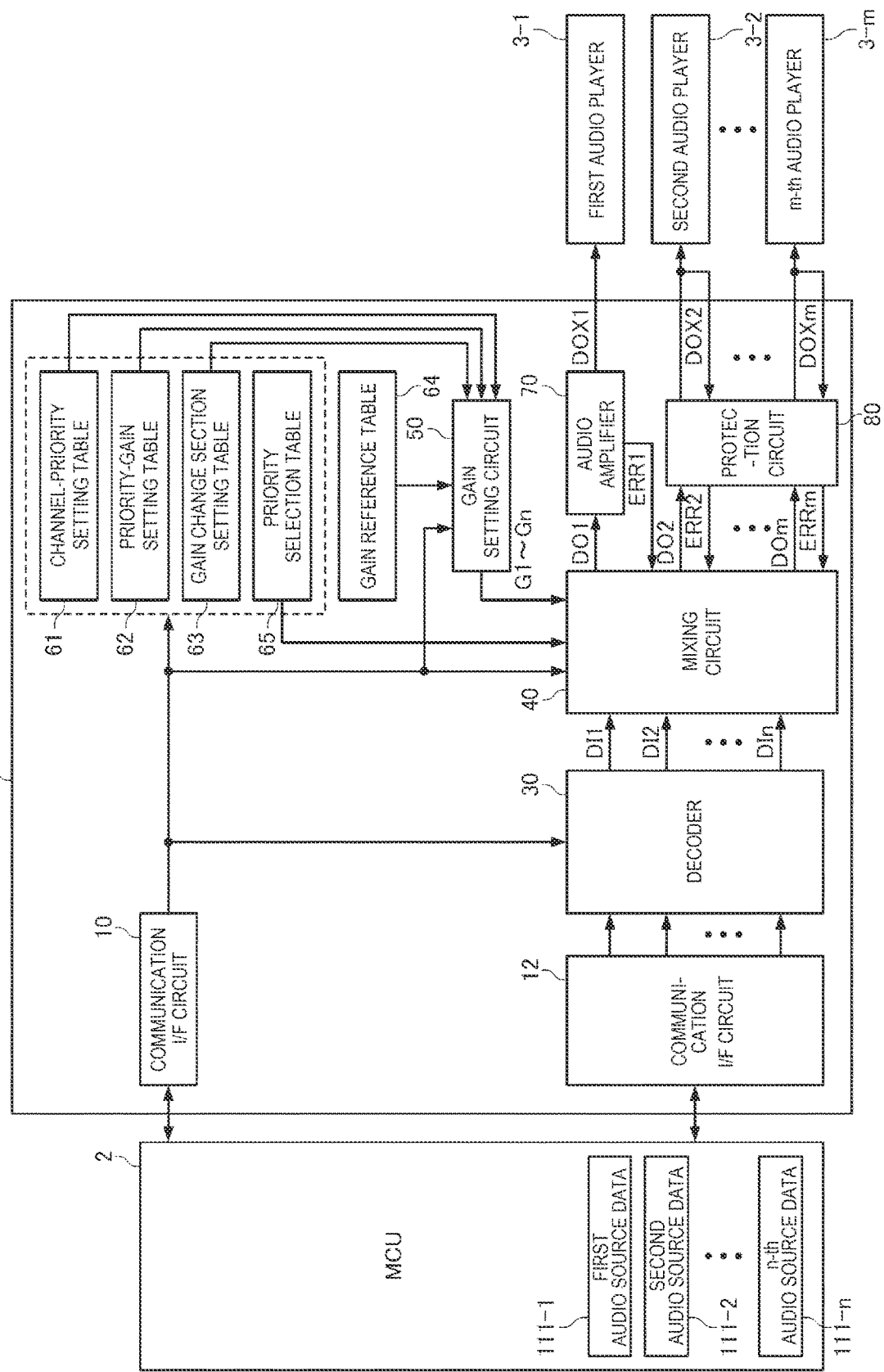
FIG. 11 is a diagram showing a configuration example of an audio mixing device according to a fourth embodiment.

FIG. 11 is a diagram showing a configuration example of the audio mixing device 1 according to the fourth embodiment. As shown in FIG. 11, the audio mixing device 1 according to the fourth embodiment includes a communication interface circuit 12 instead of the memory 20 as compared with the audio mixing device 1 according to the second embodiment shown in FIG. 7.

The communication interface circuit 12 receives first to n-th audio source data 111-1 to 111-*n* from the external micro-control unit 2 of the audio mixing device 1. The communication interface circuit 12 may be, for example, a TDM interface circuit or an I2S interface circuit. TDM is an abbreviation of time division multiplexing, and I2S is an abbreviation of inter-IC sound.

The micro-control unit 2 transmits an audio play command for the i-th audio source data 111-*i* to the communication interface circuit 10, and transmits the i-th audio source data 111-*i* to the communication interface circuit 12. The communication interface circuit 12 receives the i-th audio source data 111-*i* from the micro-control unit 2, and outputs the received i-th audio source data 111-*i* to the i-th input channel of the decoder 30.

The micro-control unit 2 may store at least a part of the first to n-th audio source data 111-1 to 111-*n* in a built-in memory (not shown). A memory (not shown) outside the micro-control unit 2 may store at least a part of the first to n-th audio source data 111-1 to 111-*n*, and the micro-control unit 2 may read the i-th audio source data 111-*i* from the memory and transmit the i-th audio source data 111-*i* to the communication interface circuit 12.

The decoder 30 decodes the i-th audio source data 101-*i* of the i-th input channel in response to a control signal that instructs audio play for the i-th audio source data 101-*i* output from the communication interface circuit 10, and demodulates the i-th audio data DIi. As described above, the first to n-th audio source data 101-1 to 101-*n* are data that serve as a base of the first to n-th audio data DI1 to DIn.

Other configurations and functions of the audio mixing device 1 according to the fourth embodiment are the same as those of the audio mixing device 1 according to the second embodiment, and description thereof will be omitted. The audio mixing device 1 according to the fourth embodiment may include the communication interface circuit 12 instead of the memory 20 as compared with the audio mixing device 1 according to the first embodiment shown in FIG. 1. In the audio mixing device 1 according to the fourth embodiment, the communication interface circuit 10 may receive various commands from a plurality of micro-control units 2, and the communication interface circuit 12 may receive a plurality of pieces of audio source data from the plurality of micro-control units 2.

According to the audio mixing device 1 of the fourth embodiment described above, the same effects as those of the audio mixing device 1 according to the first embodiment or the second embodiment are achieved. Further, the audio mixing device 1 according to the fourth embodiment includes the communication interface circuit 12 that receives the first to n-th audio source data 111-1 to 111-*n* from the external micro-control unit 2. Therefore, according to the audio mixing device 1 of the fourth embodiment, since the first to n-th audio source data 111-1 to 111-*n* can be received from the external micro-control unit 2 via the communication interface circuit 12, it is not necessary to incorporate a memory for storing the first to n-th audio source data 111-1 to 111-*n*, and a circuit size can be reduced.

2. Electronic Device

Figure 12:
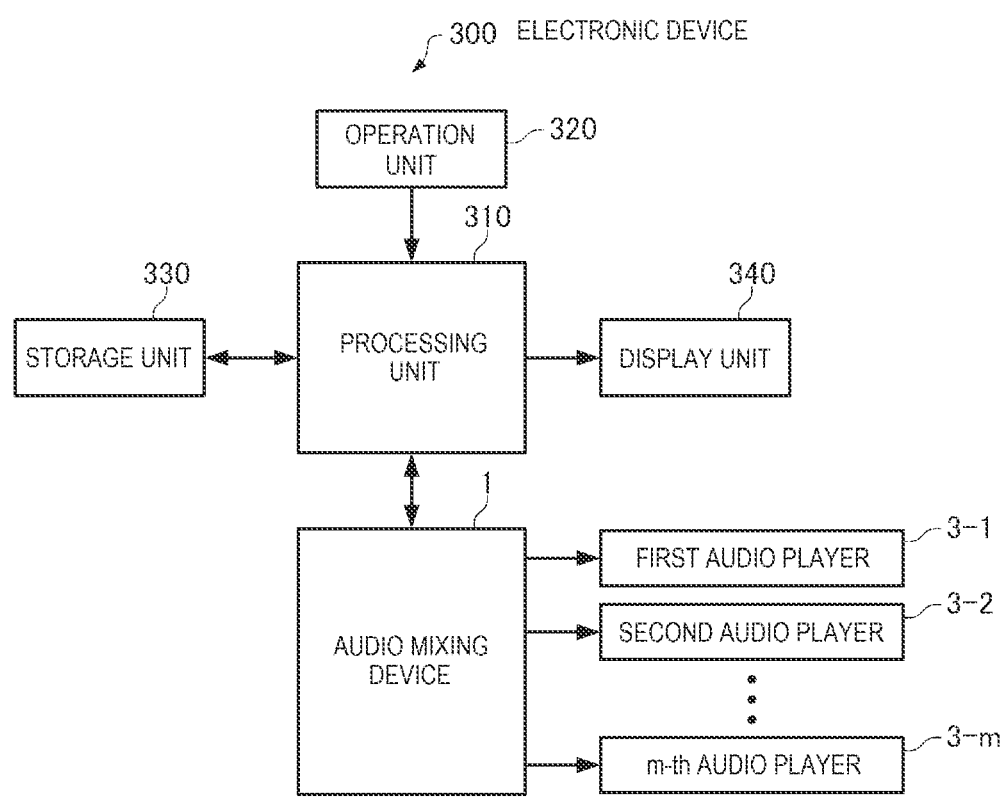
FIG. 12 is a functional block diagram showing an electronic device according to an embodiment.

FIG. 12 is a functional block diagram showing a configuration example of an electronic device according to an embodiment using the audio mixing device 1 according to an embodiment.

As shown in FIG. 12, an electronic device 300 according to the embodiment includes the audio mixing device 1, the first to m-th audio players 3-1 to 3-*m*, a processing unit 310, an operation unit 320, a storage unit 330, and a display unit 340. The electronic device 300 according to the embodiment may have a configuration in which some of the components in FIG. 12 are omitted or changed, or other components are added.

The processing unit 310 performs control processing and various kinds of data processing of each unit of the electronic device 300. For example, the processing unit 310 transmits various commands to the audio mixing device 1 to control an operation of the audio mixing device 1. The processing unit 310 performs various kinds of processing according to an operation signal from the operation unit 320, processing of transmitting a display signal for displaying various kinds of information on the display unit 340, and the like. For example, the processing unit 310 may be the micro-control unit 2 described above.

The operation unit 320 is an input device including an operation key, a button switch, and the like, and outputs an operation signal corresponding to an operation by a user to the processing unit 310.

The storage unit 330 stores programs, data, and the like for the processing unit 310 to perform various kinds of calculation processing and control processing. For example, the first to n-th audio source data may be stored in the storage unit 330, and the processing unit 310 may read the i-th audio source data from the first to n-th audio source data stored in the storage unit 330 and transmit the i-th audio source data to the audio mixing device 1. The storage unit 330 is implemented by, for example, a hard disk, a flexible disk, an MO, an MT, various memories, a CD-ROM, a DVD-ROM, or the like.

The display unit 340 is a display device implemented by an LCD or the like, and displays various kinds of information based on an input display signal. The LCD is an abbreviation of liquid crystal display. The display unit 340 may be provided with a touch panel that functions as the operation unit 320.

The audio mixing device 1 generates the mixing signal DO1 based on various commands transmitted from the processing unit 310, and outputs the audio signal DOX1 corresponding to the mixing signal DO1 to the first audio player 3-1. The audio mixing device 1 generates the audio signals DO2 to DOm or the audio signals DOX2 to DOXm based on various commands transmitted from the processing unit 310, and outputs the audio signals DO2 to DOm or the audio signals DOX2 to DOXm to the second to m-th audio players 3-2 to 3-m. Accordingly, audio is played by the first to m-th audio players 3-1 to 3-m.

Various electronic devices are conceivable as such an electronic device 300, and examples thereof include: various home electric products such as a warning device, rice cooker, IH cooking heater, vacuum cleaner, and washing machine; electronic timepiece; personal computers of mobile type, laptop type, tablet type, and the like; mobile terminals such as smartphones and cellphones; digital camera; inkjet discharge devices such as inkjet printer; storage area network devices such as router and switch; local area network device; mobile terminal base station device; television; video camera; video recorder; car navigation device; real time clock device; pager; electronic notebook; electronic dictionary; calculator; electronic game device; game controller; word processor; work station; television telephone; security television monitor; electronic binoculars; POS terminal; medical device such as electronic thermometer, blood pressure meter, blood sugar meter, electrocardiogram measuring device, ultrasonic diagnostic device, and electronic endoscope; fish finder; various measuring instruments; measuring devices of vehicles, aircrafts, and ships; flight simulator; head-mounted display; motion trace; motion tracking; motion controller; and pedestrian autonomous navigation device.

Figure 13:
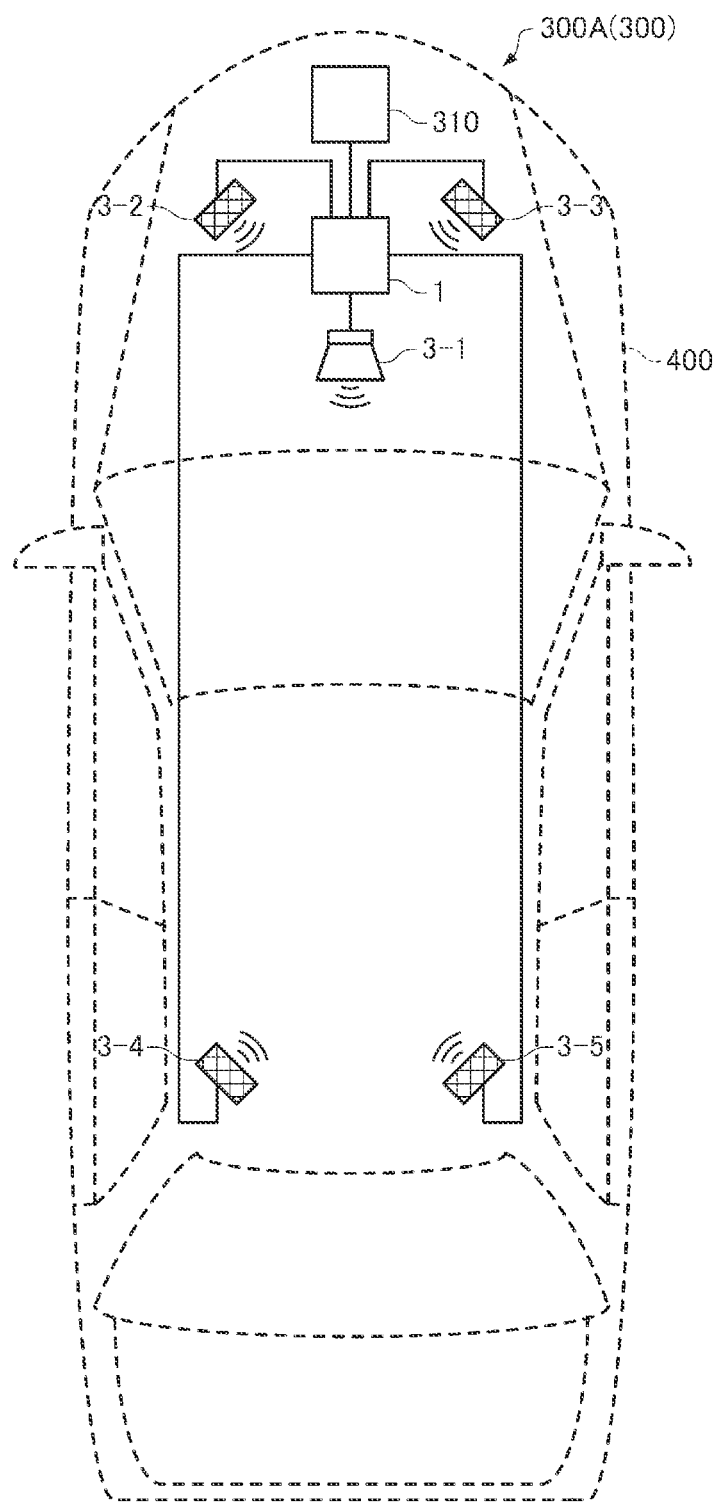
FIG. 13 is a diagram showing a configuration example of a warning device which is an example of the electronic device.

FIG. 13 is a diagram showing a configuration example of a warning device 300A which is an example of the electronic device 300. In FIG. 13, components the same as those in FIG. 12 are denoted by the same reference numerals. The warning device 300A shown in FIG. 13 is mounted on a vehicle 400. The first audio player 3-1 is a speaker, and the second to fifth audio players 3-2 to 3-5 are a buzzer.

The processing unit 310 transmits play commands and the like of various kinds of audio to the audio mixing device 1 based on signals from various sensors (not shown). The various kinds of audio include, for example, a sound imitating human voice or a warning sound for notifying abnormality of a brake, engine oil, power steering, a brake override system, or the like, traveling with a door not fully closed, unsteady traveling, traveling without releasing a parking brake, not wearing a seat belt, being close to a vehicle ahead, and the like, and a sound effect for notifying turn signal, hazard, reversing, and the like.

The audio mixing device 1 generates the mixing signal DO1 based on a part of the first to n-th audio source data corresponding to various kinds of audio based on a command from the processing unit 310, and outputs the audio signal DOX1 corresponding to the mixing signal DO1 to the first audio player 3-1.

The audio mixing device 1 generates the audio signals DO2 to DO5 or the audio signals DOX2 to DOX5 based on the other part of the first to n-th audio source data, and outputs the audio signals DO2 to DO5 or the audio signals DOX2 to DOX5 to the second to fifth audio players 3-2 to 3-5. Accordingly, various kinds of audio are played by the first to fifth audio players 3-1 to 3-5.

Since the warning device 300A includes the audio mixing device 1 capable of outputting a plurality of pieces of audio data for which a play request was received without delay, a plurality of pieces of audio for which play delay is not allowed due to high urgency can be simultaneously played without delay by the first audio player 3-1.

The present disclosure is not limited to the embodiment, and various modifications can be made without departing from a gist of the present disclosure.

The embodiments and modifications described above are merely examples, and the present disclosure is not limited thereto. For example, the embodiments and the modifications can be combined as appropriate.

The present disclosure includes a configuration substantially the same as the configuration described in the embodiment, for example, a configuration having the same function, method, and result, or a configuration having the same purpose and effect. The present disclosure includes a configuration obtained by replacing a non-essential portion of the configuration described in the embodiment. The present disclosure includes a configuration having the same function and effect as the configuration described in the embodiment, or a configuration capable of achieving the same purpose. The present disclosure includes a configuration in which a known technique is added to the configuration described in the embodiment.

The following contents are derived from the embodiments and modifications described above.

An aspect of an audio mixing device includes: a gain setting circuit configured to set first to n-th gains based on a command input from the outside, n being an integer of two or more; and a mixing circuit configured to output a mixing signal obtained by mixing two or more of first to n-th multiplication data obtained by respectively multiplying first to n-th audio data by the first to n-th gains. In a case where the j-th gain of the first to n-th gains is set to a first value, when the j-th gain is to be set to a second value different from the first value, the gain setting circuit transitions the j-th gain from the first value to the second value in a stepwise manner in a j-th gain change section of first to n-th gain change sections.

According to the audio mixing device, since a plurality of pieces of audio data respectively multiplied by a plurality of gains are mixed, it is possible to output the plurality of pieces of audio data without delay.

According to the audio mixing device, since the first to n-th gains are respectively set for the first to n-th audio data instead of a same gain, a user can easily distinguish a plurality of pieces of audio data to be simultaneously played.

In the audio mixing device, since the gain setting circuit transitions setting values of the first to n-th gains in a stepwise manner, the first to n-th multiplication data also transition in a stepwise manner. Accordingly, according to the audio mixing device, when audio based on a mixing signal obtained by mixing two or more of the first to n-th multiplication data is played, a sudden volume change is less likely to occur, and generation of an abnormal sound is prevented.

In one aspect of the audio mixing device, the mixing circuit may include first to n-th input channels, an i-th input channel of the first to n-th input channels may be set with an i-th gain of the first to n-th gains, and the i-th input channel may be configured to receive i-th audio data of the first to n-th audio data.

In one aspect of the audio mixing device, during play of the j-th audio data of the first to n-th audio data with the first value being set for the j-th gain, the gain setting circuit may set the j-th gain to the second value when the gain setting circuit receives a command to start or stop play of the k-th audio data of the first to n-th audio data which has a higher priority than the j-th audio data.

According to the audio mixing device, when the priority of the j-th audio data during play increases or decreases, a play volume of the j-th audio data can be appropriately changed.

One aspect of the audio mixing device may further include: a memory configured to store first to n-th audio source data that serve as a base of the first to n-th audio data.

According to the audio mixing device, since it is not necessary to acquire the first to n-th audio source data from the outside, it is possible to advance a timing when play of the first to n-th audio data is started.

One aspect of the audio mixing device may further include: a memory interface circuit configured to receive the first to n-th audio source data that serve as a base of the first to n-th audio data from an external memory that stores the first to n-th audio source data.

According to the audio mixing device, since the first to n-th audio source data can be received from the external memory via the memory interface circuit, it is not necessary to incorporate a memory for storing the first to n-th audio source data, and a circuit size can be reduced.

One aspect of the audio mixing device may further include: a communication interface circuit configured to receive, from an external micro-control unit, the first to n-th audio source data that serve as a base of the first to n-th audio data.

According to the audio mixing device, since the first to n-th audio source data can be received from the external micro-control unit via the communication interface circuit, it is not necessary to incorporate a memory for storing the first to n-th audio source data, and a circuit size can be reduced.

One aspect of the audio mixing device may further include: an audio amplifier configured to convert the mixing signal into an audio signal and output the audio signal to a first audio player.

According to the audio mixing device, the first audio player can play a plurality of pieces of audio data without delay.

In one aspect of the audio mixing device, the audio amplifier may be configured to determine whether the audio signal is normal or abnormal, and output an abnormality detection signal to the mixing circuit when it is determined that the audio signal is abnormal, and the mixing circuit may be configured to output the mixing signal to any one of second to m-th audio players when the abnormality detection signal is input, m being an integer of two or more.

According to the audio mixing device, even when an abnormality occurs in the first audio player or the audio amplifier, one of the second to m-th audio players can play a plurality of pieces of audio data without delay.

In one aspect of the audio mixing device, the integer m may be an integer of three or more, and when the abnormality detection signal is input, the mixing circuit may select any one of the second to m-th audio players based on a priority selection table in which a priority for selecting each of the second to m-th audio players is designated, and output a mixing signal to the selected one of the second to m-th audio players.

According to the audio mixing device, even when an abnormality occurs in the first audio player or the audio amplifier, one of the second to m-th audio players having a higher priority can play a plurality of pieces of audio data without delay.

One aspect of an electronic device includes one aspect of the audio mixing device.

What is claimed is:

1. An audio mixing device comprising:
a gain setting circuit configured to set first to n-th gains based on a command input from the outside, n being an integer of two or more; and
a mixing circuit configured to output a mixing signal obtained by mixing two or more of first to n-th multiplication data obtained by respectively multiplying first to n-th audio data by the first to n-th gains, wherein
in a case where the j-th gain of the first to n-th gains is set to a first value, when the j-th gain is to be set to a second value different from the first value, the gain setting circuit transitions the j-th gain from the first value to the second value in a stepwise manner in a j-th gain change section of first to n-th gain change sections.

2. The audio mixing device according to claim 1, wherein
the mixing circuit includes first to n-th input channels,
the i-th input channel of the first to n-th input channels is set with the i-th gain of the first to n-th gains, and
the i-th input channel is configured to receive the i-th audio data of the first to n-th audio data.

3. The audio mixing device according to claim 1, wherein during play of the j-th audio data of the first to n-th audio data with the first value being set for the j-th gain, the gain setting circuit may set the j-th gain to the second value when the gain setting circuit receives a command to start or stop play of the k-th audio data of the first to n-th audio data which has a higher priority than the j-th audio data.

4. The audio mixing device according to claim 1, further comprising:
a memory configured to store first to n-th audio source data that serve as a base of the first to n-th audio data.

5. The audio mixing device according to claim 1, further comprising:
a memory interface circuit configured to receive first to n-th audio source data that serve as a base of the first to n-th audio data from an external memory that stores the first to n-th audio source data.

6. The audio mixing device according to claim 1, further comprising:
a communication interface circuit configured to receive, from an external micro-control unit, first to n-th audio source data that serve as a base of the first to n-th audio data.

7. The audio mixing device according to claim 1, further comprising:
an audio amplifier configured to convert the mixing signal into an audio signal and output the audio signal to a first audio player.

8. The audio mixing device according to claim 7, wherein
the audio amplifier is configured to determine whether the audio signal is normal or abnormal, and output an abnormality detection signal to the mixing circuit when it is determined that the audio signal is abnormal, and
the mixing circuit is configured to output the mixing signal to any one of second to m-th audio players when the abnormality detection signal is input, m being an integer of two or more.

9. The audio mixing device according to claim 8, wherein the integer m is an integer of three or more, and
when the abnormality detection signal is input, the mixing circuit selects any one of the second to m-th audio players based on a priority selection table in which a priority for selecting each of the second to m-th audio players is designated, and outputs the mixing signal to the selected one of the second to m-th audio players.

10. An electronic device comprising:
the audio mixing device according to claim 1.

* * * * *